United States Patent [19]
Uchikoba et al.

[11] Patent Number: 5,594,397
[45] Date of Patent: Jan. 14, 1997

[54] ELECTRONIC FILTERING PART USING A MATERIAL WITH MICROWAVE ABSORBING PROPERTIES

[75] Inventors: Fumio Uchikoba; Shigeyuki Nakajima; Takashi Ito; Taro Miura; Makoto Kobayashi; Takahide Kurahashi; Yasushi Iijima, all of Tokyo, Japan

[73] Assignee: TDK Corporation, Tokyo, Japan

[21] Appl. No.: 409,682

[22] Filed: Mar. 23, 1995

[30] Foreign Application Priority Data

| Sep. 2, 1994 | [JP] | Japan | ................................ 6-209586 |
| Sep. 2, 1994 | [JP] | Japan | ................................ 6-209587 |
| Oct. 5, 1994 | [JP] | Japan | ................................ 6-241640 |
| Jan. 24, 1995 | [JP] | Japan | ................................ 7-009333 |

[51] Int. Cl.$^6$ .................................................. H01P 1/20
[52] U.S. Cl. ........................ 333/202; 174/36; 174/118; 174/258; 333/181; 333/184; 333/204; 333/206; 333/81 A
[58] Field of Search ................................ 333/22 R, 81 A, 333/202, 181–185, 204, 206, 238, 246, 243; 439/86, 88, 608; 174/36, 106 SC, 118, 258

[56] References Cited

U.S. PATENT DOCUMENTS

| 4,104,600 | 8/1978 | Mayer | 333/243 X |
| 4,146,854 | 3/1979 | Ishino et al. | 333/81 R |
| 4,297,661 | 10/1981 | Stegens | 333/204 |
| 4,301,428 | 11/1981 | Mayer | 333/12 |
| 4,371,742 | 2/1983 | Manly | 333/243 X |
| 4,543,554 | 9/1985 | Muellenheim et al. | 333/181 X |
| 5,034,710 | 7/1991 | Kawaguchi | 333/185 |
| 5,262,592 | 11/1993 | Aldissi | 174/36 |
| 5,285,164 | 2/1994 | Wong | 333/81 A X |
| 5,382,928 | 1/1995 | Davis et al. | 333/182 |

FOREIGN PATENT DOCUMENTS

| 4127701 | 4/1992 | Japan . |
| 5347502 | 12/1993 | Japan . |
| 6290946 | 10/1994 | Japan . |
| 6290992 | 10/1994 | Japan . |

OTHER PUBLICATIONS

IEEE Transactions on Microwave Theory and Techniques, vol. 42, No. 7, Jul. 1994, Hector H. Fiallo, et al., "Transmission Properties of Metal–Semiconductor–Relaxor Microstrip Lines", pp. 1176–1182.

IEEE Spectrum, Oct. 1967, H. M. Schlicke, et al., "Compatible EMI Filters", pp. 59–68.

Proceedings of the IEEE, vol. 67, No. 1, Jan. 1979, Jerry H. Bogar, et al., "Miniature Low–Pass EMI Filters", pp. 159–163.

IEEE Transactions on Electromagnetic Compatibility, Jan. 1964, Paul Schiffres, "A Dissipative Coaxial RFI Filter", pp. 55–61.

*Primary Examiner*—Paul Gensler
*Attorney, Agent, or Firm*— Oblon, Spivak, McClelland, Maier & Neustadt, P.C.

[57] ABSTRACT

A ground conductor and a signal conductor are provided in an insulating magnetic body respectively. The insulating magnetic body is a compound member that combines ferromagnetic metal particles and an insulating resin. A signal transmission element, a connector or a circuit board with high frequency stopping and low pass characteristics which will ensure reliable absorption of high frequency components in the high frequency range, can be provided.

16 Claims, 19 Drawing Sheets

ELECTRONIC FILTERING PART USING A MATERIAL WITH MICROWAVE ABSORBING PROPERTIES

BACKGROUND OF THE INVENTION

1. Field of the Invention

The present invention relates to an electronic part using a material with microwave absorbing properties. To be more specific; the present invention relates to an electronic part that attenuates frequency components in the high frequency range by absorption. The term electronic part, as defined in the present invention, includes, at least, a signal transmission element, a connector and a circuit board.

2. Discussion of Background

A low frequency pass type (high frequency stopping type) signal transmission element is typically a low pass filter. A typical low pass filter in the prior art obtains the required filter characteristics by taking advantage of differences in the frequency characteristics between impedance matching and impedance mismatching to reflect a signal that belongs to a frequency band in the high frequency range. Because of this, the undesired frequency component which has been reflected is sometimes returned to the front of the filter, which may cause, for instance, an unexpected oscillation within the circuit. An absorption type low pass filter absorbs the undesired frequency component and it remedies the problem described above, which is observed in a reflection type low pass filter.

There are absorption type low pass filters already in the known art. For instance, there is an absorption type low pass filter, already in wide use, that uses ferrite; to be more specific, ferrite beads. However, the frequency band that can be absorbed with ferrite is in the frequency range below 2 GHz. This means that, since the absorbing effect is not significant at approximately 2 GHz or higher, transmission of signals in this range is allowed.

Another approach is disclosed in U.S. Pat. No. 4,297,661 with a high pass filter whose microstrip is constituted with ferrite. This high pass filter takes advantage of the phenomenon that an absorbing effect is generated in the low frequency range and not in the high frequency range. However, this prior art technology, too, does not suppress the undesired signal component in the high frequency range of 1 GHz or higher by absorption.

Schiffres proposed a coaxial transmission line using ferrite in IEEE Transaction on Electromagnetic Compatibility, EMC—6, 55–61, 1964. This coaxial transmission line, however, was designed mainly for acquiring properties in the MHz band; transmission properties and reflecting properties in the high frequency range of 1 GHz or higher were not disclosed. It is assumed that signals in the high frequency range of 1 GHz or higher are transmitted.

A combination of a non-magnetic material which has absorbing qualities in the high frequency range and a ferrite for signal removal by absorption in the high frequency range has been reported as an attempt at signal removal. This approach includes the EMI filter proposed by Schlicke in IEEE Spectrum, 59–68, 1967 and the low pass type EMI filter proposed by Bogar in Proc. of IEEE 67 159–163 1979. In these filters, part of the insulator of the coaxial filter is constituted by laminating ferrite and a dielectric substance. In addition, Fiallo proposed, in his doctorate thesis at Pennsylvania State University in 1993 and in IEEE, Transactions on Microwave Theory Tech., MTT—42 1176, 1984, a filter with a microstrip structure that combines a ferrite and a dielectric substance. However, these prior art technologies require a complex multiple layer structure.

U.S. Pat. No. 4,146,854 discloses an attenuating element that uses ferrite beads and a wave absorbing body constituted of a metal and resin or the like compound member. Also, Japanese Unexamined Patent Publication 127701/1992 discloses technology that uses a wave absorbing material for a part of a non-magnetic microstrip line. However, in either case, the wave absorber or the wave absorbing body merely plays an auxiliary role to suppress the high frequency component which cannot be absorbed.

In addition, in U.S. Pat. No. 4,301,428, a wire or cable that includes a conductive element with suitable electric resistance and a magnetic absorbing mixture is disclosed. The conductive element has a composite structure in which a non-conductive core constituted of a resin or glass fiber is covered with a thin conductive metal layer. The magnetic absorbing mixture is non-conductive and covers the conductive element. However, since imposing an electric resistance on the signal line causes attenuation in the signal component as well as removal of the noise component, it does not suit applications that handle, for instance, micro signals. In addition, this prior art technology only discloses a wire and makes no reference to a signal transmission element.

Connectors pose a similar problem to that discussed in regard to signal transmission elements. Generally, connectors have been developed with the emphasis on achieving signal transmission with low dissipation from low frequencies through the high frequencies. Known connectors which satisfy such needs include the SMA3.5 mm type, the SMA7 mm type, the BNC type and the N type. Each of these connectors is usually constituted with one or more signal lines, a ground line and is structured in such a manner that insulation is achieved between signal lines and the ground by an insulator constituted with a resin, such as acrylic or Teflon. The characteristic impedance of the connector are determined by its shape and the body constant of the resin. In many cases it is 50 Ω.

As explained earlier, connectors have been developed with the emphasis on achieving signal transmission with low dissipation from the low frequencies through the high frequencies. However, with the recent advances in electronic technology, the advancement of digitalization of electronic circuits and the rapid development toward higher frequencies, the need for reducing high frequency noise in the GHz bands has increased drastically. In order to reduce the high frequency noise in the GHz bands, it is necessary to provide a connector with a low pass function that achieves removal of undesired high frequency components through absorption in the high frequency range. Yet, reflecting upon this background situation, it is obvious that it is extremely difficult to achieve a connector that suppresses the undesired signal components in the high frequency range of 1 GHz or higher through absorption.

The electronic part described above, which may be a signal transmission element or a connector, is intended to be used as a noise removal element only, a function that has no relation to the original function of the circuit structure. By adding these electronic parts to a circuit, frequency components in the high frequency range can be attenuated through absorption. By adding an attenuating factor that acts by absorption on frequency components in the high frequency range to a circuit board that is normally used when structuring an electronic circuit, in the form of an electronic part, such as a signal transmission element, a connector or the like, the onus on the rest of the circuit for attenuating such high frequency components through absorption can be reduced. There is even a possibility that electronic parts such as signal transmission elements and connectors that are used strictly as elements for noise removal, unrelated to achieving the original function, can be omitted.

Various attempts have already been made to suppress radiation of high frequency noise components to the outside of the circuit and, at the same time, to prevent the entry of high frequency noise components from the outside of the circuit, by shielding the circuit board itself. One example of this is the electromagnetic wave shielded printed circuit board described on page 155 of Electronic Parts Catalogue '92 compiled by the Parts Management Committee of the Japan Electronic Machinery Industry Association. However, in this case, it is necessary to enclose the board with a shielding layer, making the structure complex and, as a result, it is difficult to apply it in a limited way, to specific circuits formed on the circuit board. In addition, it is obvious when reflecting upon the background situation, that it is extremely difficult to achieve a circuit board that suppresses the undesired signal components in the high frequency range of 1 GHz or higher through absorption.

SUMMARY OF THE INVENTION

It is an object of the present invention to provide an electronic part with high frequency stopping and low pass characteristics which will ensure reliable absorption of high frequency components in the high frequency range.

It is a further object of the present invention to provide an electronic part with high frequency stopping and low pass characteristics which ensures reliable absorption of high frequency components at 1 GHz or higher.

It is a still further object of the present invention to provide an electronic part with a simple structure.

It is a still further object of the present invention to provide an electronic part which can make the best use of the magnetic dissipating properties of ferromagnetic metal particles by allowing a high frequency magnetic field to permeate the inside of the ferromagnetic metal particles efficiently and thoroughly regardless of the skin effect in ferromagnetic metals.

It is a still further object of the present invention to provide an electronic part that achieves extremely small attenuation of the signal component and can be used in applications that involve handling micro signals.

In order to achieve the objects described above, the electronic part according to the present invention comprises an insulating magnetic body, at least one ground conductor and at least one signal conductor. Each conductor is provided in the insulating magnetic body, which is a compound member that combines ferromagnetic metal particles and an insulating resin.

Since the electronic part according to the present invention is provided with at least one ground conductor and at least one signal conductor in the insulating magnetic body, an electronic part for performing signal transmission is achieved by grounding the ground conductor and inserting the signal conductor into the signal transmission path in an application to a signal transmission passage. Such an electronic part may be a signal transmission element, a connector or a circuit board.

Ferromagnetic metal is a substance that demonstrates high magnetic permeability and high magnetic dissipation factors over a wide frequency range and has, at the same time, high conductivity, as is obvious when we consider a typical example of metal iron. Because of this, if it is used in a large stop, the magnetic dissipation property of a ferromagnetic metal such as iron cannot be utilized fully because, due to the skin effect, a high frequency magnetic field will not penetrate the iron. Therefore, in the present invention, a ferromagnetic metal is used in the form of particles. By doing so, the magnetic dissipation of a ferromagnetic metal such as iron can be effectively utilized by allowing the high frequency magnetic field to penetrate deeply into the individual ferromagnetic metal particles.

According to the present invention, the insulating magnetic body includes an insulating resin and ferromagnetic metal particles. The ferromagnetic metal particles are electrically insulated by the insulating resin, which coexists in the insulating magnetic body, so that no electric current can run among the particles. This causes a magnetic dissipation in a state in which the individual ferromagnetic metal particles are electrically independent of one another, to achieve outstanding high frequency magnetic dissipation over a wide frequency range.

As has been explained, according to the present invention, the undesired high frequency components in the high frequency range which are included in a signal passing through the signal conductor can be reliably absorbed through the absorbing effect of the insulating magnetic body. To be more specific, a low pass signal transmission element which has the absorption effect (high frequency stopping) in the high frequency band of 1 GHz or higher and which passes signals that belong in the lower frequency bands is achieved.

Also, the impedance can be maintained almost constant up to a frequency of approximately 20 GHz and reflection can be kept at approximately −10 dB.

Furthermore, the insulating magnetic body that absorbs high frequency components is constituted of a compound member which combines ferromagnetic metal particles and an insulating resin and the ground conductor and the signal conductor are both provided at the insulating magnetic body, achieving a very simple structure.

With the electronic part according to the present invention, when constituting the insulating magnetic body, ferromagnetic metal particles with a particle size in the range of 0.01 μm to 100 μm can be used. When selecting the ideal particle size from the aforementioned particle size range, one of the most desirable means is to determine the particle size of the ferromagnetic metal particles based upon a skin thickness which will allow a high frequency magnetic field within the range of operating frequencies to enter the inside of the particles. By doing so, the high frequency magnetic field can be ensured to thoroughly permeate virtually all of the ferromagnetic metal particles present in the insulating magnetic body. As a result, almost all ferromagnetic metal particles present in the insulating magnetic body contribute to producing the magnetic dissipation, greatly improving the efficiency of their use.

The ground conductor can be provided either on the surface of, or inside the insulating magnetic body. If the ground conductor is to be provided on the surface of the insulating magnetic body, it may be provided either to enclose the insulating magnetic body or not.

The signal conductor can be provided either by adhering it to the surface of the insulating magnetic body or by embedding it in the insulating magnetic body. The signal conductor may be linear, curved or spiral. Which of the these structures should be used depends upon the type of electronic part being manufactured.

If the signal conductor is to be formed in a spiral, it is desirable to coil it in such a manner that each turn is wound ahead at approximately equal intervals in the direction of the coil axis, with the turning angle being constant throughout. With this structure, even when an electrically long line is formed within a limited volume, the magnetic fluxes generated in the individual turns do not cancel out one another overall and, as a result, a large inductance can be obtained which, in turn, provides a large attenuating factor.

A spiral signal conductor may be coiled around an insulating magnetic body other than the one which has been mentioned earlier, for example, a ferrite magnetic body. In such a case, an absorption type filter, which provides sufficient loss characteristics even in a frequency band of 1 GHz or less is achieved.

In the connector according to the present invention, the aforementioned signal conductor is provided in such a manner that it passes through the insulating magnetic body. The aforementioned ground conductor is mounted on the insulating magnetic body and is electrically insulated from the signal conductor by the insulating magnetic body. The insulating magnetic body is constituted of a compound material that combines ferromagnetic metal particles and an insulating resin.

In the connector according to the present invention, the signal conductor is provided in such a manner that it passes through the insulating magnetic body. Thus, the signal line can be connected to either one side or both sides of the terminal conductor. Since the ground conductor is mounted on the insulating magnetic body and is electrically insulated from the signal conductor by the insulating magnetic body, a simply structured connector with the ground conductor grounded and the terminal conductor insulated from the ground conductor by the insulating magnetic body is achieved.

The type and particle size of the ferromagnetic metal particles that are selected to constitute the insulating magnetic body and their function and the type and effect of the insulating resin that are selected to constitute the insulating magnetic body have been already described. By choosing them in this manner, a connector which is suited to be used for connecting a circuit that is exposed to high frequency noise of 1 GHz or more, is achieved.

The circuit board according to the present invention includes at least two conductors and an insulating magnetic body. The conductors are provided on the two opposite sides of the insulating magnetic body, so as to sandwich the insulating magnetic body. The insulating magnetic body is constituted of a compound material that combines ferromagnetic metal particles and an insulating resin. Of the two conductors, one is used as a ground conductor and the other is used as a signal conductor. In an actual operating state, whichever conductor is not grounded is patterned as a signal conductor.

In the circuit board according to the present invention, conductors are provided on the two opposite sides of the insulating magnetic body, so as to sandwich the insulating magnetic body. Consequently, one of the conductors can be used as a ground conductor and the other can be used as a signal conductor. In an actual operating state, one conductor is grounded and is patterned as a ground conductor and the other is patterned as a signal conductor so that the whole can serve as a circuit board.

The type and particle size of the ferromagnetic metal particles that are selected to constitute the insulating magnetic body and their function and the type and effect of the insulating resin that are selected to constitute the insulating magnetic body have been already described.

With the circuit board according to the present invention, the high frequency noise components which are included in a signal passing through the signal conductor can be reliably absorbed through the absorbing effect of the insulating magnetic body in the state in which the conductors are already patterned to achieve a required circuit pattern and the circuit parts already mounted. Thus, a circuit board which is suited to be used in a circuit that is exposed to high frequency noise of 1 GHz or higher, is achieved. Moreover, the structure in which the ground conductor and the signal conductor are provided on the insulating magnetic body achieves a high degree of simplicity. It can be easily applied to any circuit.

BRIEF DESCRIPTION OF THE DRAWINGS

These and other advantages, features and objects of the present invention will be understood by those of ordinary skill in the art referring to the annexed drawings, given purely by way of non-limitative example, in which;

FIGS. 29 and 30 is employed to achieve an improvement in the outside band characteristics of the band pass filter which is inserted in high frequency power amplifying circuit in a mobile phone or the like;

FIGS. 29 and 30 is employed as a filter for removing undesired signals in an intermediate frequency amplifying circuit;

DETAILED DESCRIPTION OF THE PREFERRED EMBODIMENTS

Figure 1:
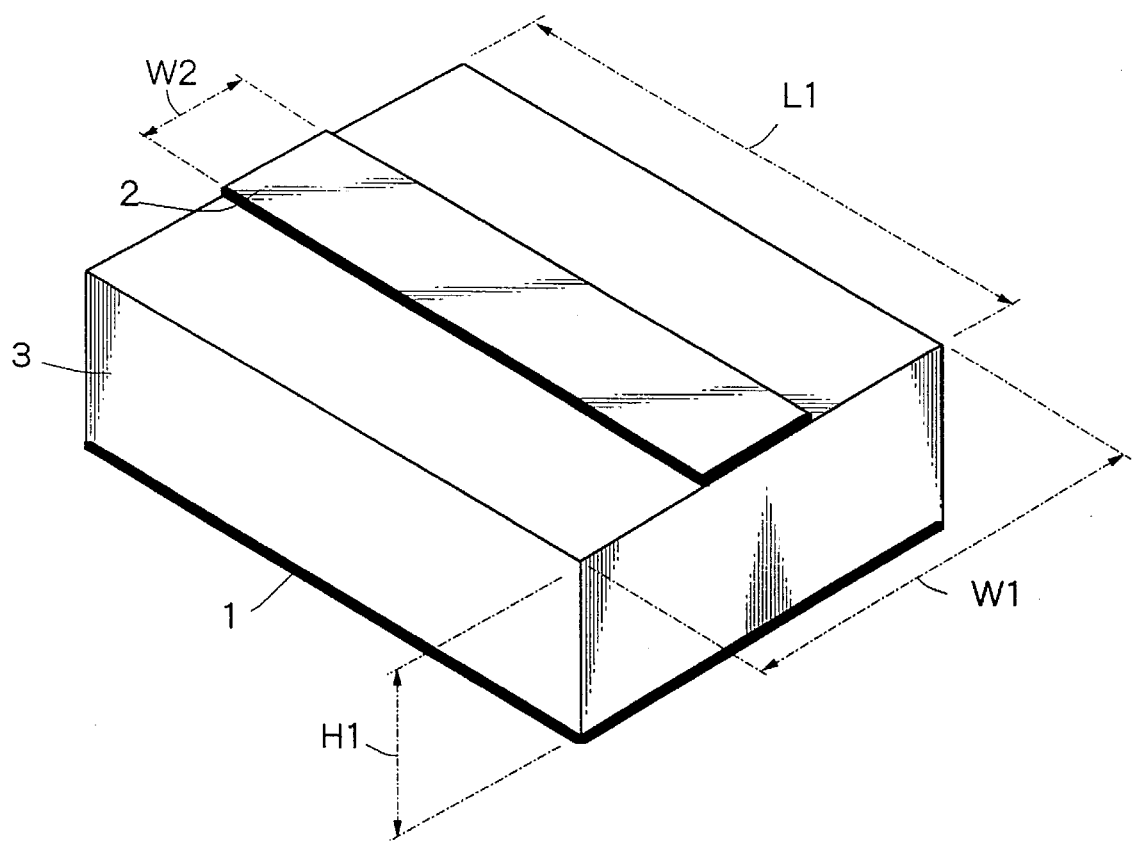
FIG. 1 is a perspective of the signal transmission element according to the present invention.

First, the signal transmission element according to the present invention is explained in reference to FIG. 1. This type of signal transmission element is used, for instance, as a low frequency pass absorption type filter. The signal transmission element according to the present invention includes, at least, one ground conductor 1, at least one signal conductor 2 and an insulating magnetic body 3. The ground conductor 1 and the signal conductor 2 are provided at the insulating magnetic body 3, separated by a gap. In the signal transmission element shown in the FIG., the ground conductor 1 is provided on one surface of the insulating magnetic body 3 and the signal conductor 2 is provided on another surface of the insulating magnetic body 3.

The insulating magnetic body 3 is constituted of a compound member in which ferromagnetic metal particles and an insulating resin are mixed. The ferromagnetic metal particles should be, for instance, fine particles of pure iron (carbonyl iron particles) which are obtained by thermally decomposing carbonyl iron. When these iron particles are hardened into an insulating substance, a member is obtained that demonstrates high loss characteristics over the millimeter wave range. Apart from iron, other metals such as nickel and cobalt may be used for the ferromagnetic metal particles. Furthermore, an amorphous alloy may be used for the ferromagnetic metal particles. One metal may be used to constitute all of the ferromagnetic particles or different metals may be used in combination.

The insulating resin to be mixed with the ferromagnetic metal particles is not restricted to any particular type, but it has been confirmed that good characteristics are achieved with phenol, epoxy and rubber resins. Here too, just one type may be used or different types may be used in combination. When using iron for the ferromagnetic metal particles, if the base material is composed of relatively large particles, several different types of commercially available iron particles may be sifted through mesh. By doing this, different particle sizes ranging from 0.01 µm to 100 µm can be selected.

Since the signal transmission element according to the present invention is provided with at least one ground conductor 1 and at least one signal conductor 2 in the insulating magnetic body 3, by grounding the ground conductor 1 and inserting the signal conductor 2 into the signal transmission passage in a signal transmission application, a signal transmission element for performing signal transmission is achieved.

Since the insulating magnetic body 3 includes the ferromagnetic metal particles, a high frequency magnetic field penetrates deeply into the inside of the individual ferromagnetic metal particles and the magnetic dissipation of a ferromagnetic metal such as iron can be effectively utilized. In addition, the insulating magnetic body includes an insulating resin as well as the ferromagnetic metal particles. Consequently, the ferromagnetic metal particles are electrically insulated by the insulating resin which coexists in the insulating magnetic body 3 so that no electric current runs among the particles. This causes a magnetic dissipation with individual ferromagnetic metal particles in the state in which they are electrically independent of one another, achieving a large high frequency magnetic dissipation over a wide frequency range.

As has been explained, with the signal transmission element according to the present invention, undesired high frequency components in the high frequency range that are included in a signal passing through the signal conductor 2 can be reliably absorbed through the absorbing effect of the insulating magnetic body 3. To be more specific, a low pass signal transmission element, which has an absorbing effect (high frequency stopping) in the high frequency band of 1 GHz or higher and which passes signals in the lower frequency bands, is achieved. Also, the impedance can be maintained almost constant up to a frequency of approximately 20 GHz and reflection can be kept at approximately −10 dB. These characteristics make it suitable to be used as a low pass filter.

Furthermore, the insulating magnetic body 3, which absorbs the high frequency component, is constituted of a compound member which combines ferromagnetic metal particles and an insulating resin with the ground conductor 1 and the signal conductor 2 both being provided at the insulating magnetic body 3, thereby achieving a very simple structure.

The low pass and high frequency stopping mechanism in the signal transmission element according to the present invention is as described below. When the reflection coefficient of the element is assigned $\Gamma$ and the transmissivity is assigned T, the reflection gain S11 ($\omega$) and the transmission gain S21 ($\omega$) in the transmission path are expressed with the following formulae:

$$S11\ (\omega) = (1-T^2)\Gamma/(1-T^2\Gamma^2)$$

$$S21\ (\omega) = (1-\Gamma^2)T/(1-T^2\Gamma^2)$$

$$\Gamma = \{(\mu_{\it eff}/\epsilon_{\it eff})^{1/2} - Zo\}/\{(\mu_{\it eff}/\epsilon_{\it eff})^{1/2} + Zo\}$$

$$T = \exp\{-\omega(\mu_{\it eff}\epsilon_{\it eff})^{1/2}X\}$$

In the expressions above, $\epsilon_{\it eff}$ indicates the complex effective dielectric constant of the material and $\mu_{\it eff}$ is the complex effective magnetic permeability of the material. In reality, form factors are added to the complex effective dielectric constant and the complex effective magnetic permeability of the material to obtain the complex effective dielectric constant $\epsilon_{\it eff}$ and the complex effective magnetic permeability $\mu_{\it eff}$. Zo indicates the characteristic impedance of the circuit.

First, in order to produce absorption in the high frequency range, the transmissivity T must be close to 0. This requires that ($\mu\epsilon$) be either an imaginary number or a negative real number. In other words, if either one of, or both $\epsilon$ and $\mu$ have an imaginary number component and, at the same time, the larger that value, the larger the absorption in the transmission line. This means that the dissipation coefficient (D) of the material is large in the high frequency range.

Also, in order to reduce the reflection (reduce S11) over the entire frequency range, the reflection coefficient $\Gamma$ must be close to 0. Accordingly, $(\mu_{\it eff}/\epsilon_{\it eff})^{1/2}$ must be close to the characteristic impedance Zo over the entire frequency range.

In the case of the absorption phenomenon caused by ferrite or the like, the imaginary number component normally reaches 0 at approximately 2 GHz and the transmissivity T approaches 1 1in the high frequency range. As a result, the low pass effect cannot be achieved.

In contrast, the compound member used in the present invention shows a prominent degree of absorption starting at about 1 GHz and continuing up through 20 GHz and higher, together dielectric absorption. Consequently, unlike in ferrite material, the transmissivity T is close to 0 up to the high frequency range.

Generally, the real number components of the dielectric coefficient $\epsilon$ and the magnetic permeability $\mu$ become reduced as the frequency is lowered in the range where absorption occurs. Because of this, when absorption is occurring, the characteristic impedance Zo of the signal transmission element changes along with the frequency and consequently, the reflection coefficient $\Gamma$ increases, to promote reflection.

However, with the compound member used in the present invention, although the magnetic permeability becomes greatly reduced when the frequency goes up, the dielectric constant, too, becomes reduced at the same time. This, in turn, contributes to reducing the change in impedance, resulting in reduced reflection. Therefore, a low pass filter which yields a high frequency stopping effect through absorption in the high frequency range is achieved and a signal transmission element with reduced reflection is thus obtained.

Next, a manufacturing method for producing the signal transmission element described above is explained in simplified terms. First, a rectangular parallelopiped specimen approximately 10 mm long by 5 mm wide by 30 mm thick was formed by mixing ferromagnetic particles and insulating resin and then pressing. The insulating resin was then hardened by implementing a suitable thermal treatment on the specimen to obtain a compound member. After the specimen was adjusted to a thickness of 0.4 mm, the insulating magnetic body 3 was obtained through a cutting process. The resulting insulating magnetic body 3 was 10 mm long, L1, 5 mm wide, W1 and 0.4 mm thick, H1. The ground conductor 1 was formed over the entire surface of one side of this insulating magnetic body 3 and, at the same time, the signal conductor 2 was formed on the surface opposite the surface with the ground conductor. The ground conductor 1 and the signal conductor 2 may be formed by, for instance, vacuum deposition. The electrode width of the signal conductor 2 was adjusted to achieve an element characteristic impedance of 50Ω. Through this process, a signal transmission element with a microstrip line structure, in which the width W2 of the line and the length of the signal line were approximately 0.3 mm to 0.8 mm and 10 mm respectively, was obtained.

In order to evaluate the characteristics of the signal transmission element thus prepared, the transmission characteristics S11 and S21 of the insulating magnetic material according to the present invention, which constitutes the insulating magnetic body 3, were measured.

For evaluation, these measured values were then compared against the transmission characteristics, S11 and S21, of the reference samples which employ insulating magnetic materials of the prior art. There were two types of samples used as reference examples, i.e., in one sample, NiZn ferrite (high frequency ferrite material) was used for the insulating magnetic material and in the other, NiZn ferrite-rubber compound material was used. We used a network analyzer HP8720C (manufactured by Hewlett Packard) and a measuring gauge HP83040 (manufactured by Hewlett Packard) in order to evaluate the signal transmission elements. In order to measure the complex dielectric constant and the complex magnetic permeability up to 1 GHz with an impedance analyzer HP4291A (manufactured by Hewlett Packard) plane parallel plate capacitors and toroidal cores were prepared with the insulating magnetic materials described above. In the high frequency range of 1 GHz or over, the toroidal cores prepared using the insulating magnetic materials described above were inserted in a jig (AIR LINE HP85051-60007 manufactured by Hewlett Packard) and the measurements were made with a network analyzer HP8720C (manufactured by Hewlett Packard) using the software program HP85071A (manufactured by Hewlett Packard).

Figure 2:
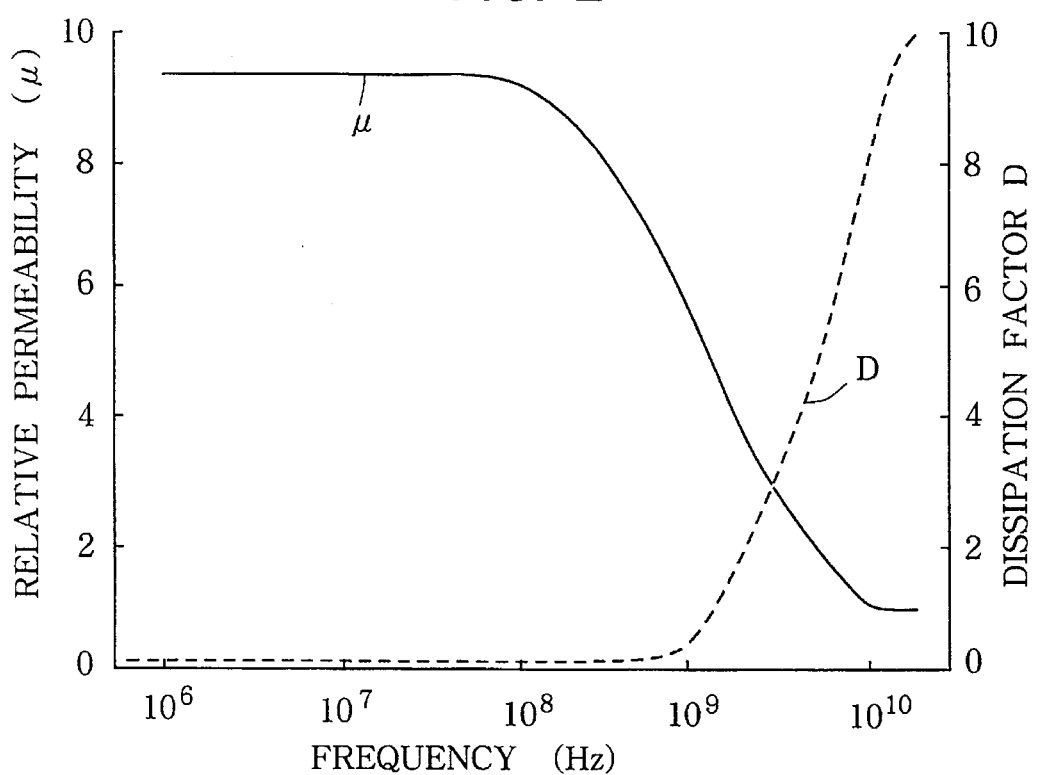
FIG. 2 shows the frequency-complex magnetic permeability characteristics of the iron-phenol resin compound member.
Figure 3:
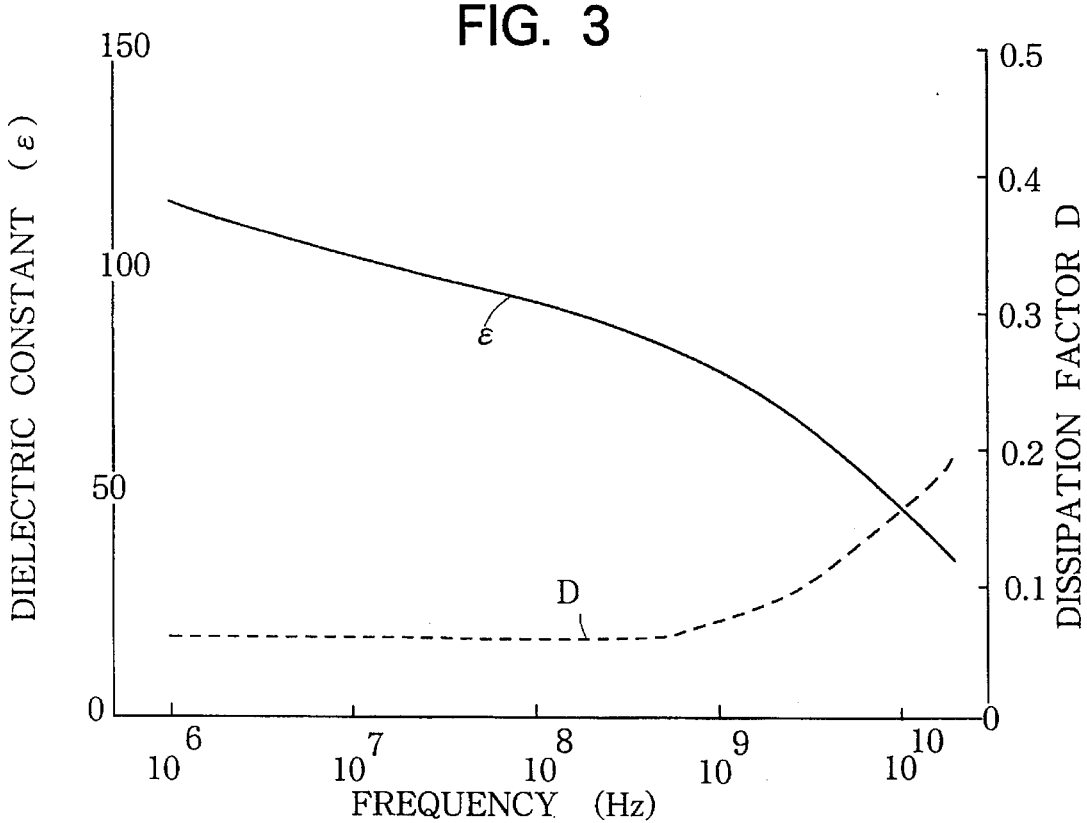
FIG. 3 shows the frequency-complex dielectric constant characteristics of the iron-phenol resin compound member.
Figure 4:
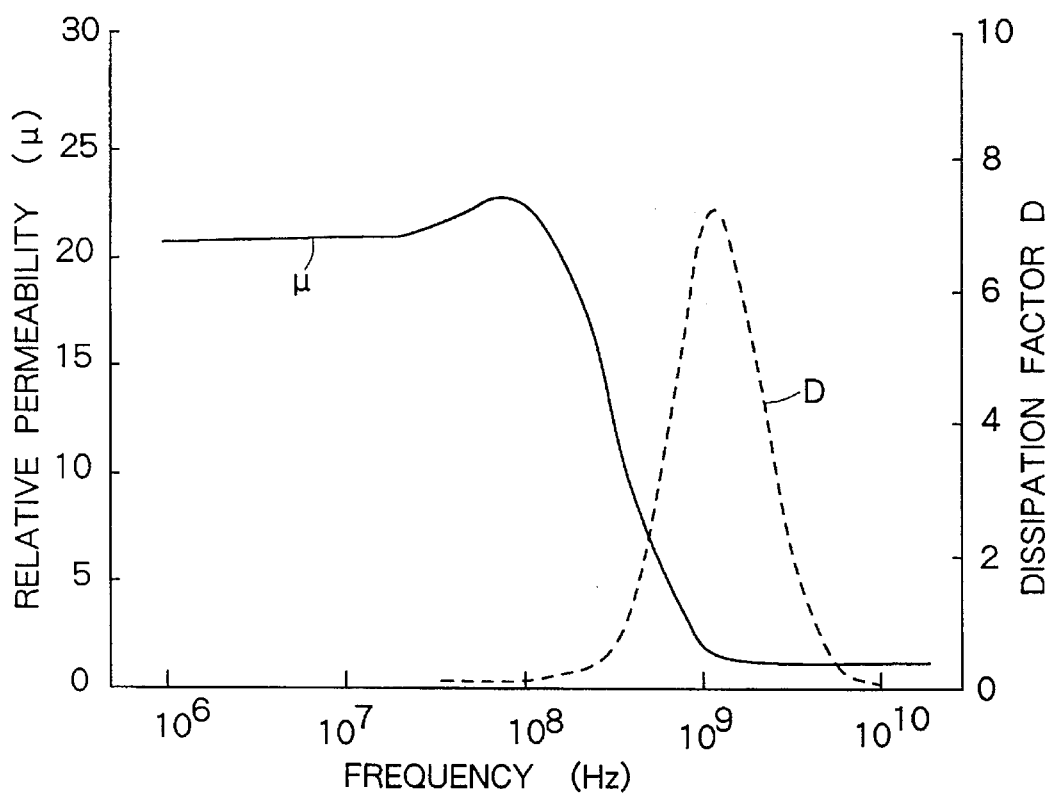
FIG. 4 shows the frequency-complex magnetic permeability characteristics of the NiZn ferrite in the prior art.
Figure 5:
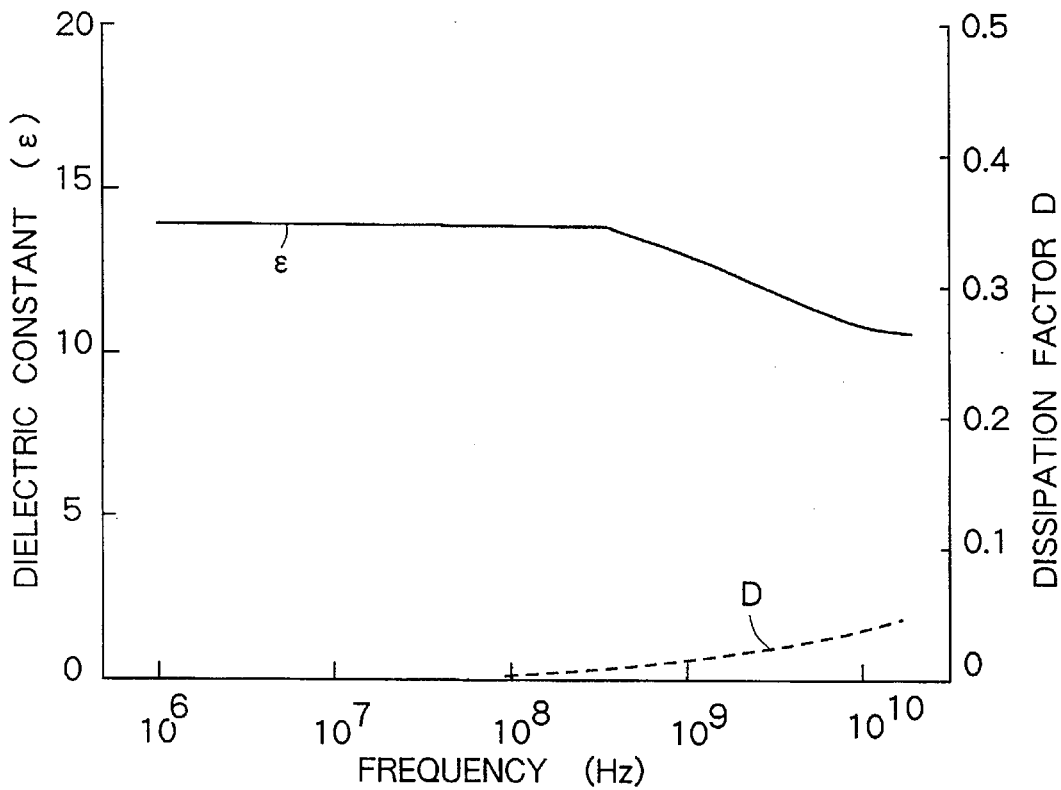
FIG. 5 shows the frequency-complex dielectric constant characteristics of the NiZn ferrite in the prior art.

FIG. 2 shows the complex magnetic permeability characteristics of the iron-phenol resin compound member (iron 60 vol %, particle diameter 2μm) and FIG. 3 shows the complex dielectric constant characteristics of the iron-phenol resin compound member (iron 60 vol %, particle diameter 2 μm). FIGS. 4 and 5 show the complex magnetic permeability and the complex dielectric constant characteristics respectively of the NiZn ferrite in the prior art. In the FIGS., the horizontal axis indicates the frequency and the vertical axis indicates the relative magnetic permeability μ or the relative dielectric constant ε and the dissipation factor D.

In the case of the iron-phenol resin compound member, the dissipation factor D, which is related to the magnetic permeability (refer to FIG. 2) and the dissipation factor D related to the dielectric constant (refer to FIG. 3) increase in the GHz range and this tendency is maintained throughout the high frequency range. The relative magnetic permeability μ becomes reduced as the dissipation factor D increases (refer to FIG. 2). It is also observed that the relative dielectric constant ε also becomes gradually reduced as the dissipation factor D increases (refer to FIG. 3).

In the case of the NiZn ferrite, as shown in FIG. 4, the dissipation factor D takes on a large value at approximately 1 GHz and in the frequency range above 1 GHz, the value is almost 0. With this, the relative magnetic permeability μ, too, becomes drastically reduced in the GHz range and approaches 1. Also, as shown in FIG. 5, the relative dielectric coefficient ε shows only a slight reduction tendency and the change in the dissipation factor resulting from this is also very slight. This means that when the insulating base is constituted with the NiZn ferrite, there is an area in the GHz range where the filtering characteristics are lost.

Figure 6:
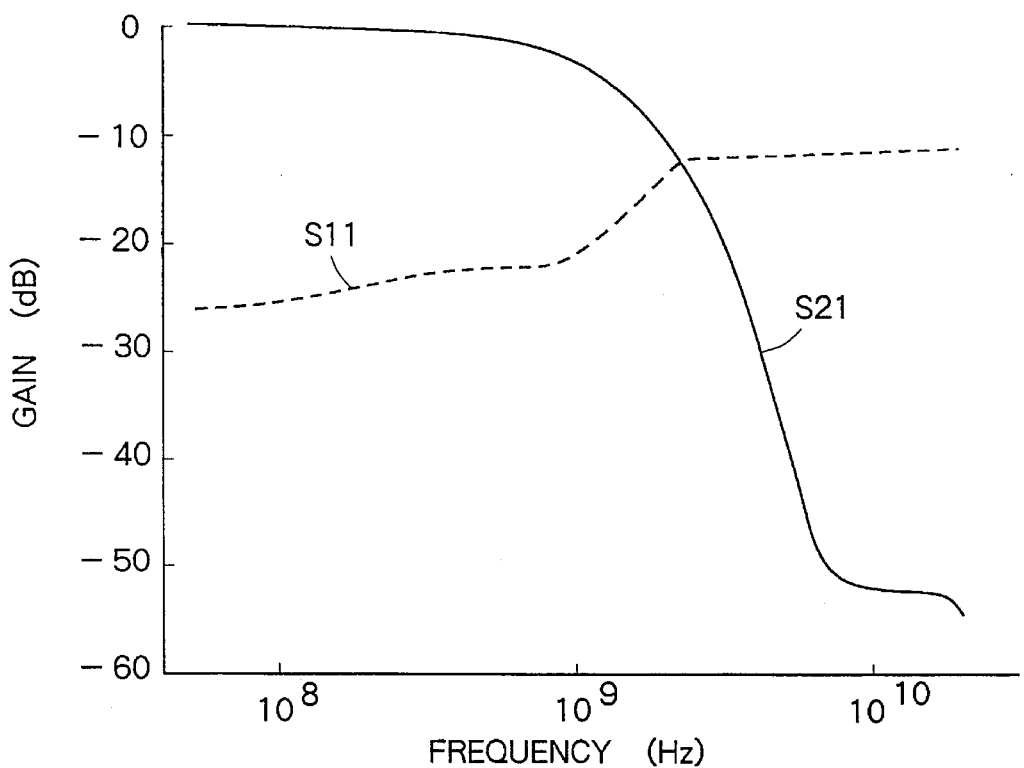
FIG. 6 shows the transmission characteristics when the iron-phenol resin compound member is used.

FIG. 6 shows the transmission characteristics observed when the iron-phenol resin compound member (iron 60 vol %, particle diameter 2 mm the specimen in FIGS. 2 and 3) was used. As shown in the FIG., the attenuation in the transmission characteristics S21 becomes pronounced at approximately 1 GHz and this attenuation continues up to 20 GHz, which is the upper limit of the measurement. This means that a low pass filter is constituted. As for the reflection characteristics S11, attenuation of −10 dB is observed up to approximately 10 GHz, indicating that the reflection is sufficiently inhibited.

Figure 7:
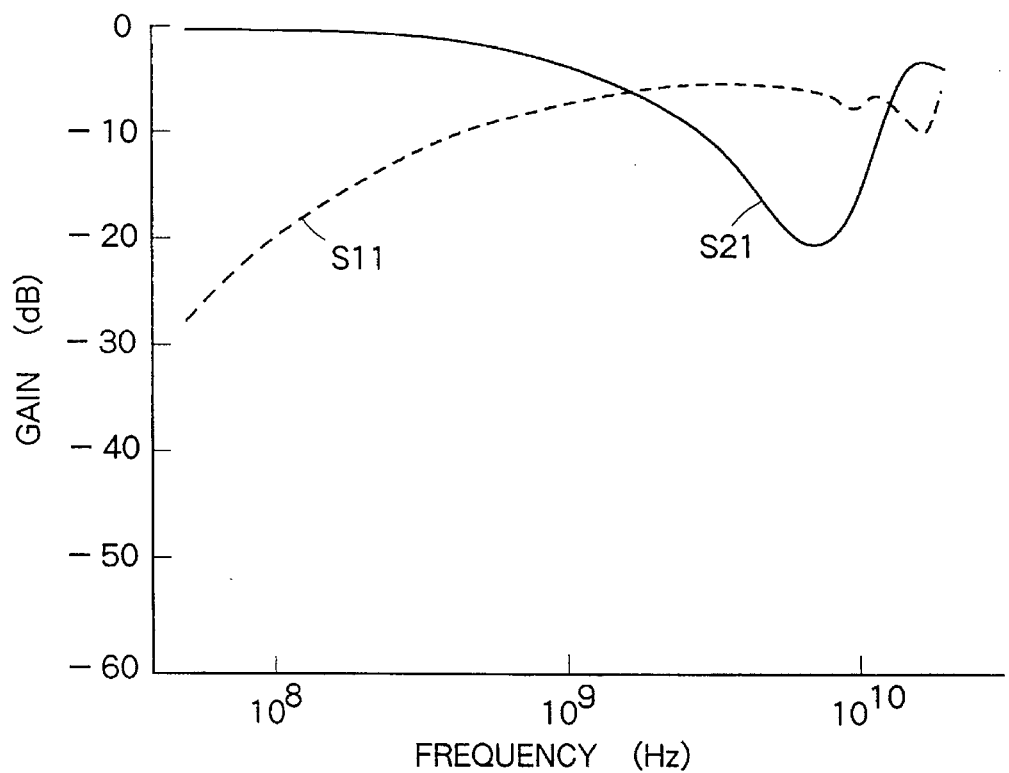
FIG. 7 shows the transmission characteristics when the NiZn ferrite in the prior art is used.
Figure 8:
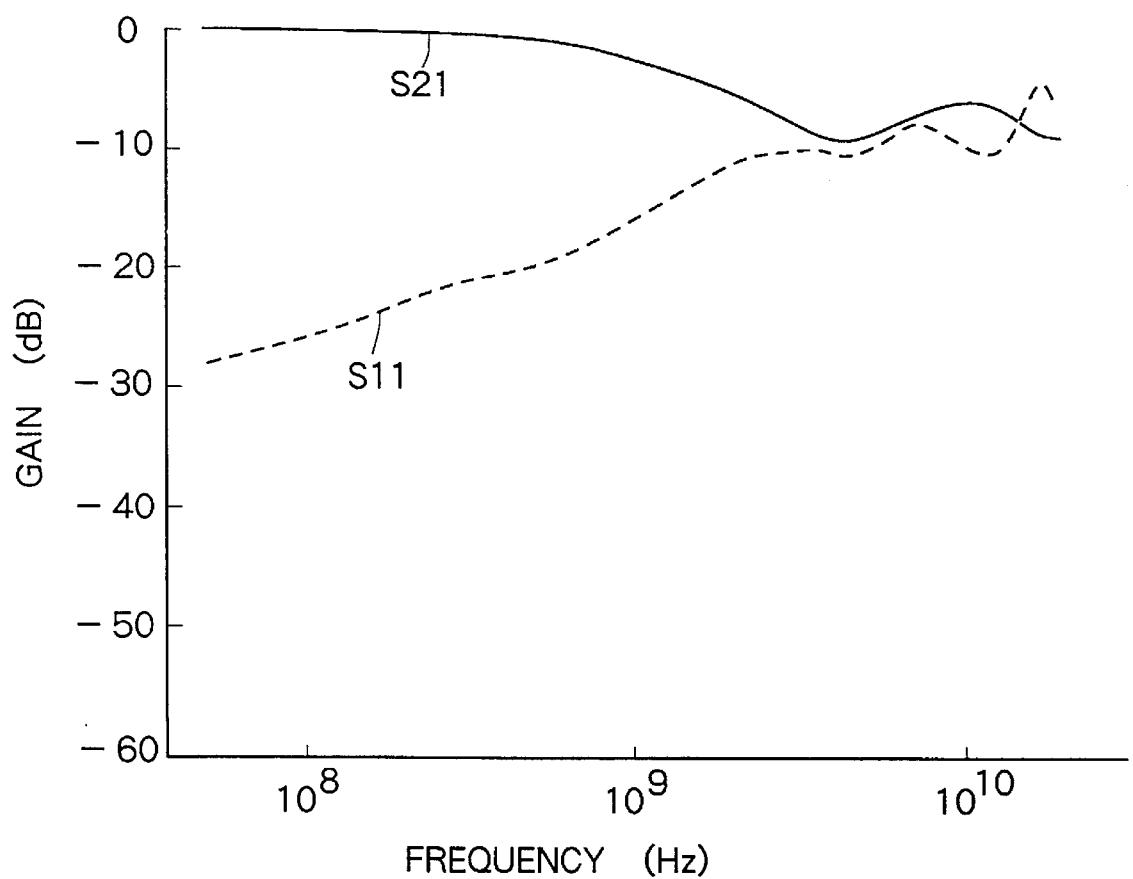
FIG. 8 shows the transmission characteristics when a compound member constituted of the NiZn ferrite-rubber resin in the prior art is used.

FIG. 7 shows the transmission characteristics observed when the NiZn ferrite in the prior art was used. Although attenuation of the transmission characteristics S11 is observed at approximately 1 GHz, the attenuation is reduced again at high frequencies exceeding 10 GHz, indicating that the low pass characteristics are not obtained. FIG. 8 shows the transmission characteristics observed when a compound member constituted of the NiZn ferrite-rubber resin in the prior art was used. In this case, too, as in FIG. 7, the low pass characteristics cannot be achieved.

Table 1 shows the entire evaluation results of the transmission characteristics of various elements, specimens numbered 1 to 38, which were prepared by using iron for the ferromagnetic metal particles and also by changing the particle diameters and iron content. In Table 1, the transmission characteristics S11 and S12 were evaluated by gains of the transmission characteristics S11 and S21 in various cases with the frequency in the passing range at 100 MHz and the frequency in the stopping range at 5 GHz. Phenol, epoxy and rubber resins were used for the insulating resin.

TABLE 1

| No. | iron particle size μm | iron content vol % | transmission gain (S21) dB 100 MHz | 5 GHz | reflection gain (S11) dB 100 MHz | 5 GHz | resin |
|---|---|---|---|---|---|---|---|
| 1 | 0.005 | 30 | −0.3 | −20 | −20 | −5 | phenol *1 |
| 2 | 0.01 | 40 | −0.2 | −28 | −25 | −10 | phenol |
| 3 | 0.1 | 40 | −0.2 | −30 | −25 | −10 | phenol |
| 4 | 0.5 | 60 | −0.2 | −34 | −25 | −10 | phenol |
| 5 | 1 | 60 | −0.2 | −35 | −25 | −10 | phenol |
| 6 | 2 | 60 | −0.2 | −37 | −24 | −10 | epoxy |
| 8 | 3 | 60 | −0.2 | −40 | −25 | −11 | epoxy |
| 9 | 5 | 60 | −0.2 | −40 | −25 | −12 | epoxy |
| 10 | 10 | 60 | −0.2 | −40 | −25 | −12 | epoxy |
| 11 | 30 | 60 | −0.2 | −40 | −26 | −11 | epoxy |
| 12 | 80 | 60 | −0.2 | −40 | −26 | −12 | epoxy |
| 13 | 100 | 60 | −0.3 | −35 | −25 | −10 | epoxy |
| 14 | 200 | 60 | −1.3 | −20 | −15 | −8 | epoxy *2 |
| 15 | 1 | 10 | −0.2 | −10 | −25 | −8 | epoxy |
| 16 | 1 | 20 | −0.2 | −12 | −25 | −10 | epoxy |
| 17 | 1 | 30 | −0.2 | −20 | −24 | −11 | epoxy |
| 18 | 1 | 40 | −0.2 | −23 | −25 | −10 | epoxy |
| 19 | 1 | 50 | −0.2 | −30 | −24 | −11 | epoxy |
| 20 | 1 | 55 | −0.2 | −33 | −26 | −11 | epoxy |
| 21 | 1 | 63 | −0.2 | −45 | −25 | −12 | epoxy |
| 22 | 1 | 65 | −0.2 | −27 | −23 | −10 | epoxy |
| 23 | 1 | 70 | −0.2 | −25 | −23 | −10 | epoxy |
| 24 | 1 | 75 | −0.2 | −25 | −23 | −10 | epoxy |
| 25 | 1 | 80 | −0.4 | −25 | −23 | −8 | epoxy |
| 26 | 1 | 90 | −1.2 | −20 | −25 | −5 | epoxy *1 |
| 27 | 10 | 10 | −0.2 | −10 | −22 | −9 | phenol |
| 28 | 10 | 20 | −0.2 | −12 | −25 | −9 | phenol |
| 29 | 10 | 30 | −0.2 | −15 | −24 | −10 | rubber |
| 30 | 10 | 40 | −0.2 | −25 | −23 | −10 | rubber |
| 31 | 10 | 50 | −0.2 | −30 | −24 | −10 | rubber |
| 32 | 10 | 55 | −0.2 | −40 | −26 | −10 | rubber |
| 33 | 10 | 63 | −0.2 | −40 | −25 | −10 | phenol |

TABLE 1-continued

| No. | iron particle size µm | iron content vol % | transmission gain (S21) dB 100 MHz | 5 GHz | reflection gain (S11) dB 100 MHz | 5 GHz | resin |
|---|---|---|---|---|---|---|---|
| 34 | 10 | 65 | −0.2 | −27 | −22 | −10 | phenol |
| 35 | 10 | 70 | −0.2 | −27 | −24 | −9 | epoxy |
| 36 | 10 | 75 | −0.4 | −27 | −25 | −10 | epoxy |
| 37 | 10 | 80 | −1.0 | −27 | −23 | −8 | epoxy |
| 38 | 10 | 90 | −1.5 | −20 | −21 | −5 | epoxy |

*1: irregular dispersion
*2: occurrence of roughness

The specimens numbered 2 to 13, 17 to 23 and 29 to 35, which contain iron particles whose particle diameters range from 0.01 µm to 100 µm at content ratios of 30 vol % through 70 vol %, showed transmission gains S21 of (−0.2 dB) to (−0.3 dB) with the passing range frequency at 100 MHz and of (−15 dB) to (−45 dB) with the stopping range frequency at 5 GHz, indicating that the attenuation is small at 100 MHz frequency in the passing range and that it is great at 5 GHz in the stopping range. Also, the reflection gain S11 was within the range of (−22 dB) to (−26 dB) at the passing range frequency of 100 MHz and of (−9 dB) to (−12 dB) at the stopping range frequency at 5 GHz.

In comparison, the specimen number 1, which contained iron particles whose diameter was 0.005 µm, the specimen number 14, which contained iron particles whose diameter was 200 µm and the specimens numbered 15, 16, 25 to 28 and 36 to 38 whose iron particle contents were not within the range of 30 vol % through 75 vol % were demonstrated to be inferior in either transmission gain S21 or reflection gain S11 at 1 MHz frequency in the passing range and at 5 GHz in the stopping range. This leads to the conclusion that it is desirable to use iron particles whose particle diameter are within the range of 0.01 µm to 100 µm at iron content in the range of 30 vol % to 75 vol %. Note that no significant difference was observed in these characteristics that were attributable to specific types of insulating resins employed.

Figure 9:
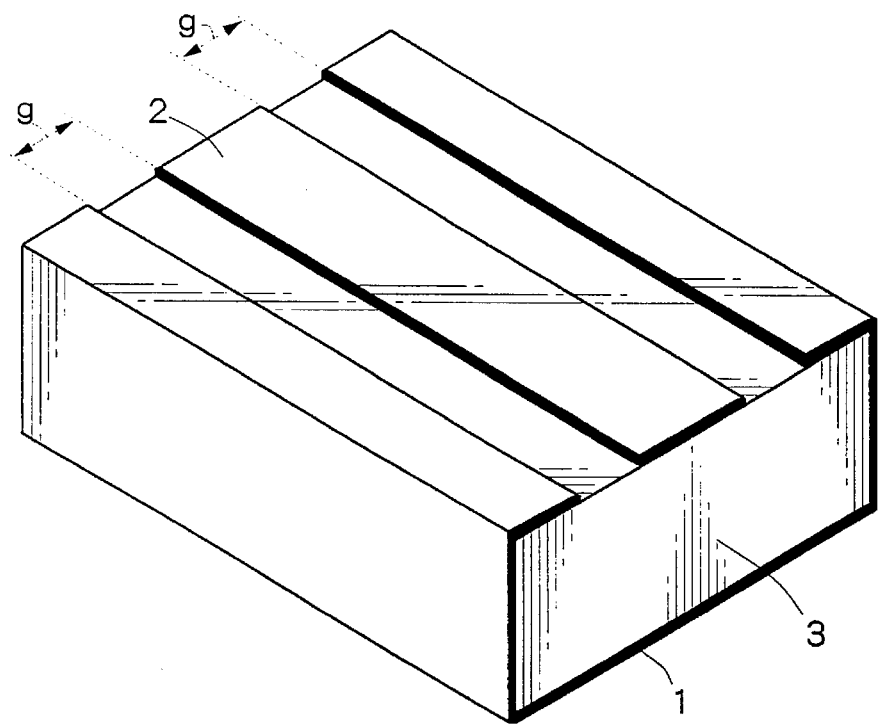
FIG. 9 is a perspective of another embodiment of the signal transmission element according to the present invention.
Figure 10:
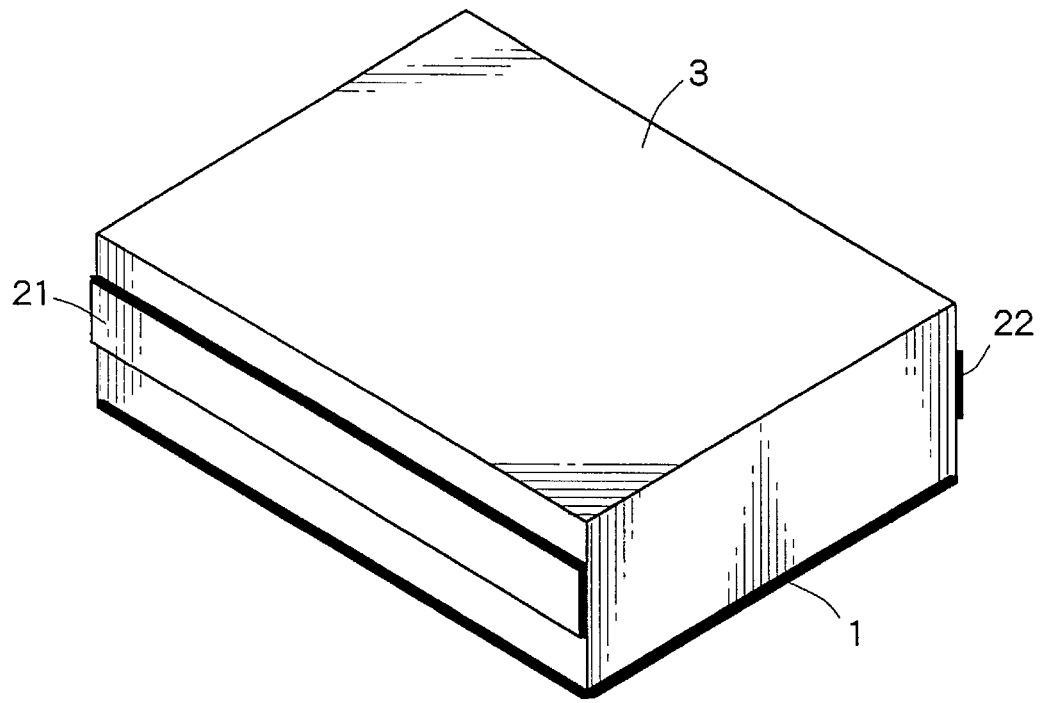
FIG. 10 is a perspective of yet another embodiment of the signal transmission element according to the present invention.

Next, in reference to FIGS. 9 through 14, other embodiments of the signal transmission element according to the present invention are explained. In these FIGS., the same reference numbers are assigned to components identical to those in FIG. 1 and their explanation is omitted. In FIG. 9, the ground conductor 1 is provided continuously over the entire surface of one side of the insulating magnetic body 3, with the two ends in the direction of its width extending around to partially cover the surface on the other side so as to form gaps between it and the signal conductor 2, which is formed on the other surface of the insulating magnetic body 3. In FIG. 10, the ground conductor 1 is provided over the entire surface of one side of the insulating magnetic body 3 and the signal conductors 21 and 22 are provided on either side surface of the insulating magnetic body 3 in the direction of its width.

Figure 11:
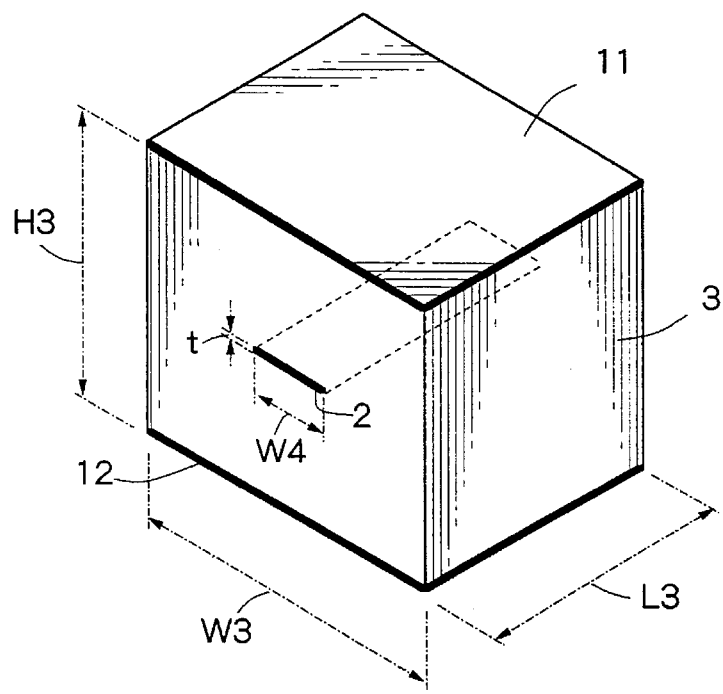
FIG. 11 is a perspective of yet another embodiment of the signal transmission element according to the present invention.
Figure 12:
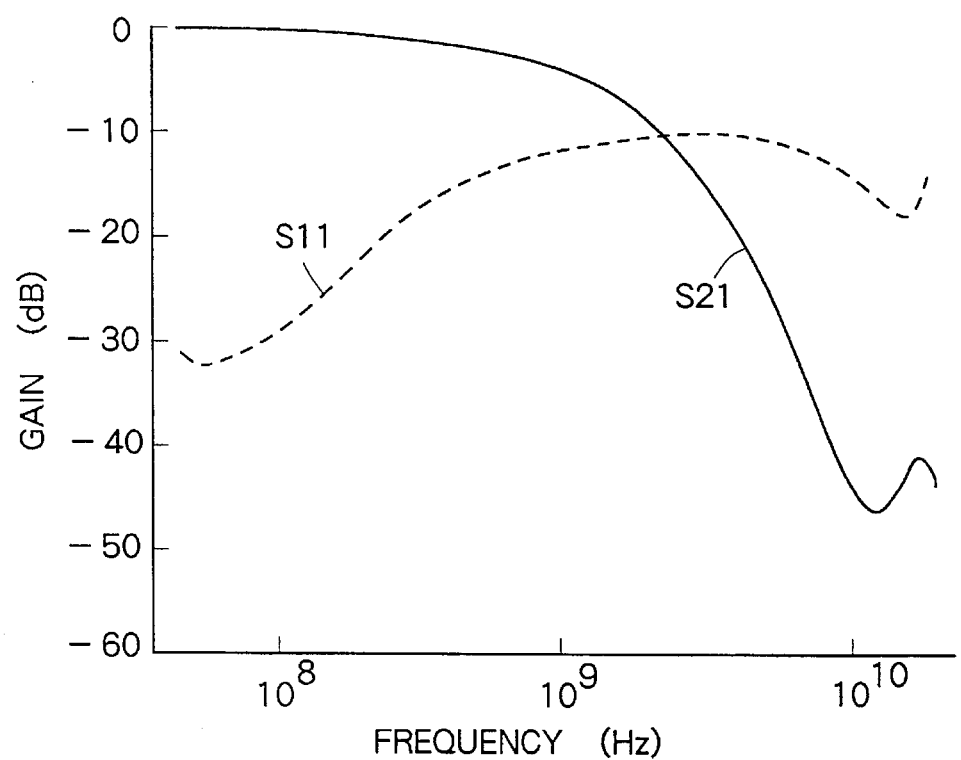
FIG. 12 shows the transmission characteristics of the signal transmission element shown in FIG. 11.

In the signal transmission element shown in FIG. 11, ground conductors 11 and 12 are provided on surfaces of the insulating magnetic body 3 that face opposite each other and the signal conductor 2 is embedded inside the insulating magnetic body 3 while facing opposite the ground conductors 11 and 12. This particular signal transmission element, therefore, is of the tri-plate type. Although not shown, the signal transmission element according to the present invention may take a structure which is provided with other ground conductors provided on the remaining two surfaces of the insulating magnetic body 3 for a total of 4 ground conductors, one on each of the 4 surfaces. FIG. 12 shows the transmission characteristics of the signal transmission element shown in FIG. 11. The line width W4 and the line thickness t of the signal conductor 2 are selected at 1 mm and 30 µm respectively. The insulating magnetic body 3 is constituted with a iron-phenol resin compound member (iron 50 vol %, particle diameter 2 µm). The dimensions of the signal transmission element are set at 4 mm in width, W3, 3.5 mm in thickness, H3 and 3.2 mm in length, L3. As shown in the FIG. 12, attenuation of the transmission characteristics S21 becomes pronounced at approximately 1 GHz, and this attenuation continues up to 20 GHz, which is the upper limit in the measurement. This means that a low pass filter is constituted. As for the reflection characteristics S11, attenuation of −10 dB is observed up to approximately 10 GHz, indicating that the reflection is sufficiently inhibited.

Figure 13:
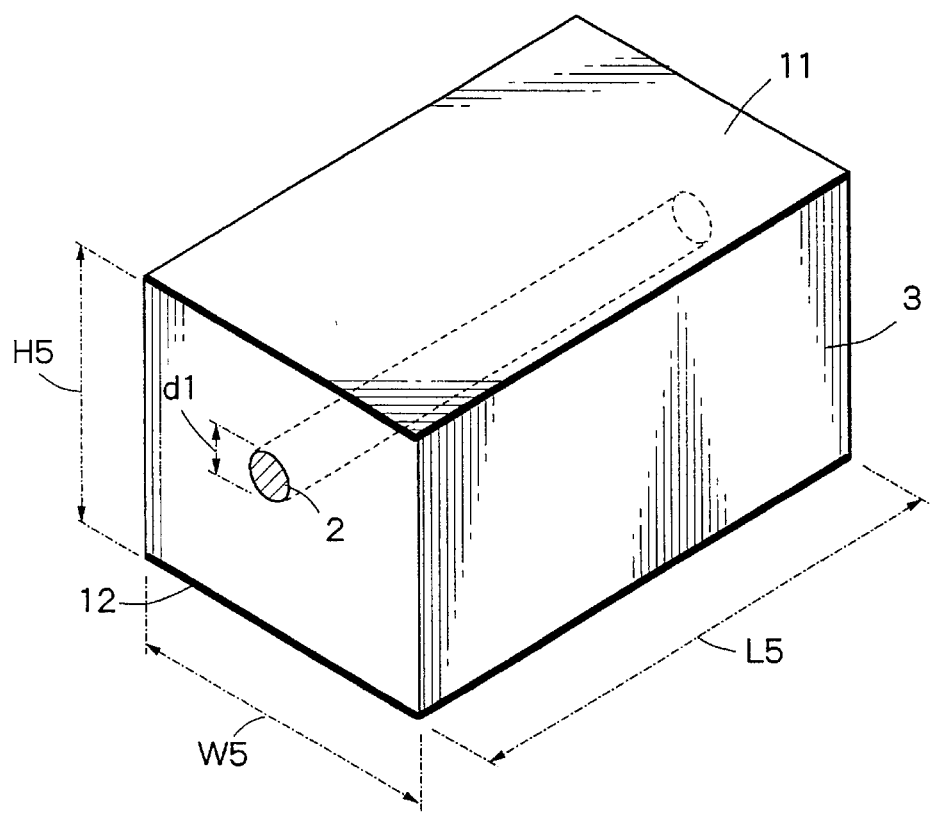
FIG. 13 is a perspective of yet another embodiment of the signal transmission element according to the present invention.
Figure 14:
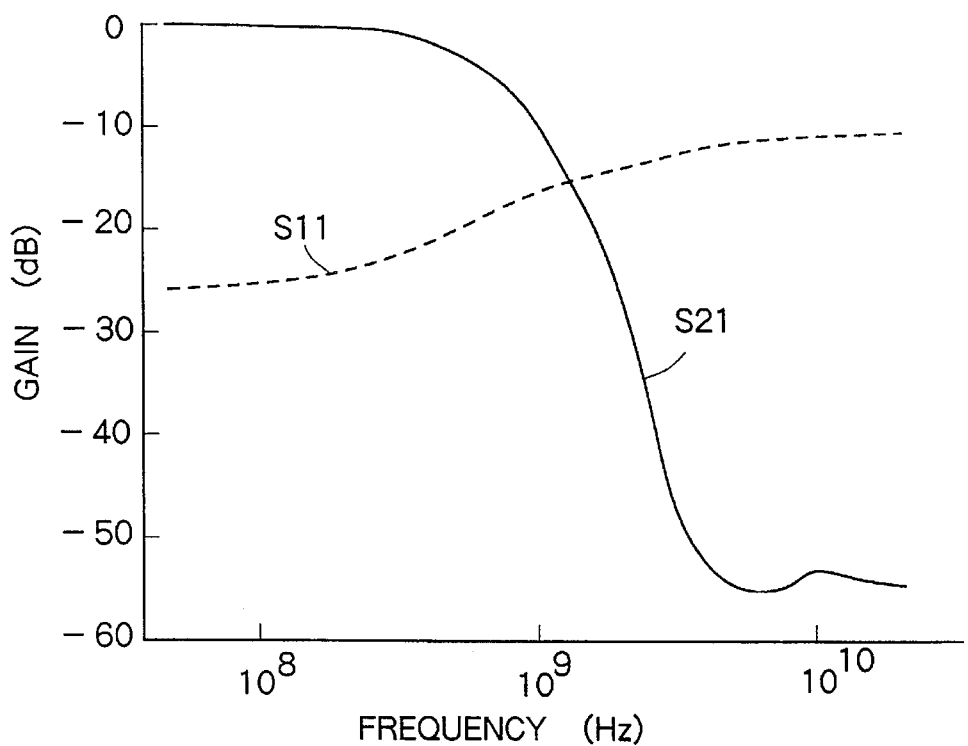
FIG. 14 shows the transmission characteristics of the signal transmission element shown in FIG. 13.

In the signal transmission element shown in FIG. 13, the ground conductors 11 and 12 are provided opposite each other on opposite surfaces of the insulating magnetic body 3 and the signal conductor 2 is embedded in the insulating magnetic body while facing opposite the ground conductors 11 and 12. The signal conductor 2 is constituted with a round copper wire. FIG. 14 shows the transmission characteristics of the signal transmission element shown in FIG. 13, in which the signal conductor 2 is constituted with a copper wire, the diameter d1 of which is set at 0.2 mm with the insulating magnetic body 3 being constituted of an iron-phenol resin compound member (iron 50 vol %, particle diameter 2 µm). The dimensions of which are set at 4 mm in width, WS, 3.5 mm in thickness, H5 and 10 mm in length LS. As shown in FIG. 14, attenuation of the transmission characteristics S21 becomes pronounced at approximately 1 GHz, and this attenuation continues up to 20 GHz, which is the upper limit in the measurement. This means that a low pass filter is constituted. As for the reflection characteristics S11, attenuation of approximately −10 dB is observed up to approximately 10 GHz indicating that the reflection is sufficiently inhibited.

Figure 15:
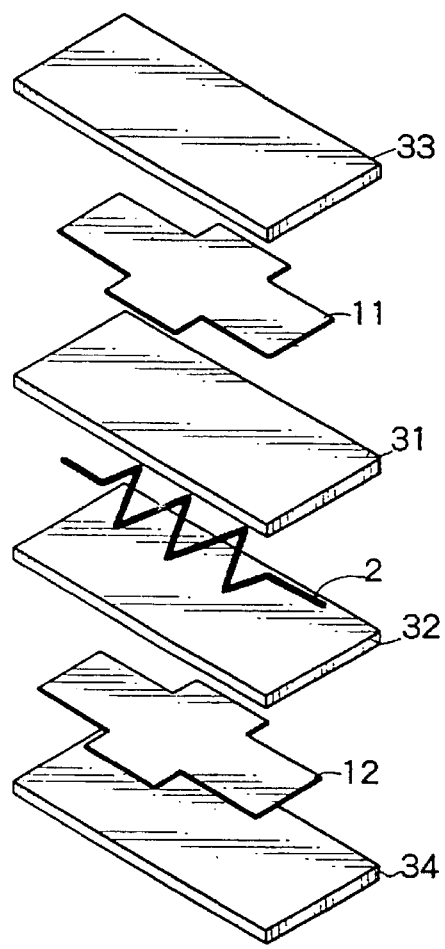
FIG. 15 is a exploded and disbursed view of yet another embodiment of the signal transmission element according to the present invention.
Figure 16:
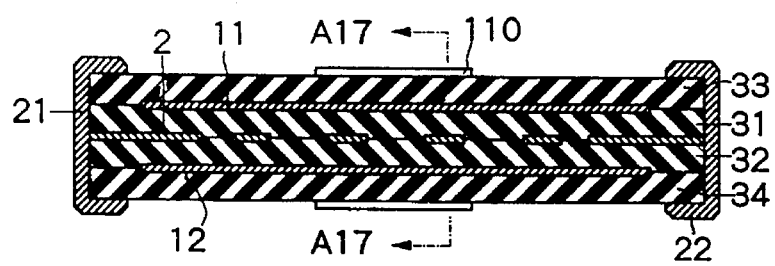
FIG. 16 is a cross section of the signal transmission element shown in FIG. 15.
Figure 17:
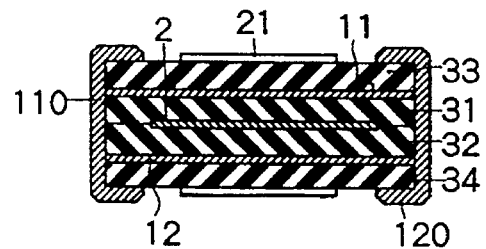
FIG. 17 is a cross section of the signal transmission element shown in FIG. 16 along line A17—A17.

FIG. 15 is a exploded perspective of yet another embodiment of the signal transmission element according to the present invention, FIG. 16 is a cross section of the signal transmission element shown in FIG. 15 and FIG. 17 is a cross section through the line A17—A17 of the signal transmission element shown in FIG. 16. The ground conductors 11 and 12 are provided on either of the external surfaces of the insulating magnetic bodies 31 and 32. The signal conductor 2 is embedded in the insulating magnetic body which is formed with the insulating magnetic bodies 31 and 32. The signal conductor 2 is structured as a meander line. On the outsides of the ground conductors 11 and 12, insulating protective layers 33 and 34 respectively are laminated. These insulating protective layers 33 and 34 may be constituted of the same material as that constituting the insulating magnetic bodies 31 and 32 or they may be constituted of a different material. Both ends of the ground conductors 11 and 12 in the direction of their width are connected to either of the ground terminal electrodes 110 and 120 which are attached to the edges at both ends of the insulating magnetic bodies 31 and 32 and the insulating protective layers 33 and 34 in the direction of their width (or length). Both ends of the ground conductors 11 and 12 in the direction of their length (or width) are sealed off by the insulating magnetic bodies 31 and 32. The signal conductor 2 is connected to terminal electrodes 21 and 22 which are bonded to the edges of both ends of the insulating magnetic bodies 31 and 32 and the insulating protective layers 33 and 34 in the direction of their length.

Figure 18:
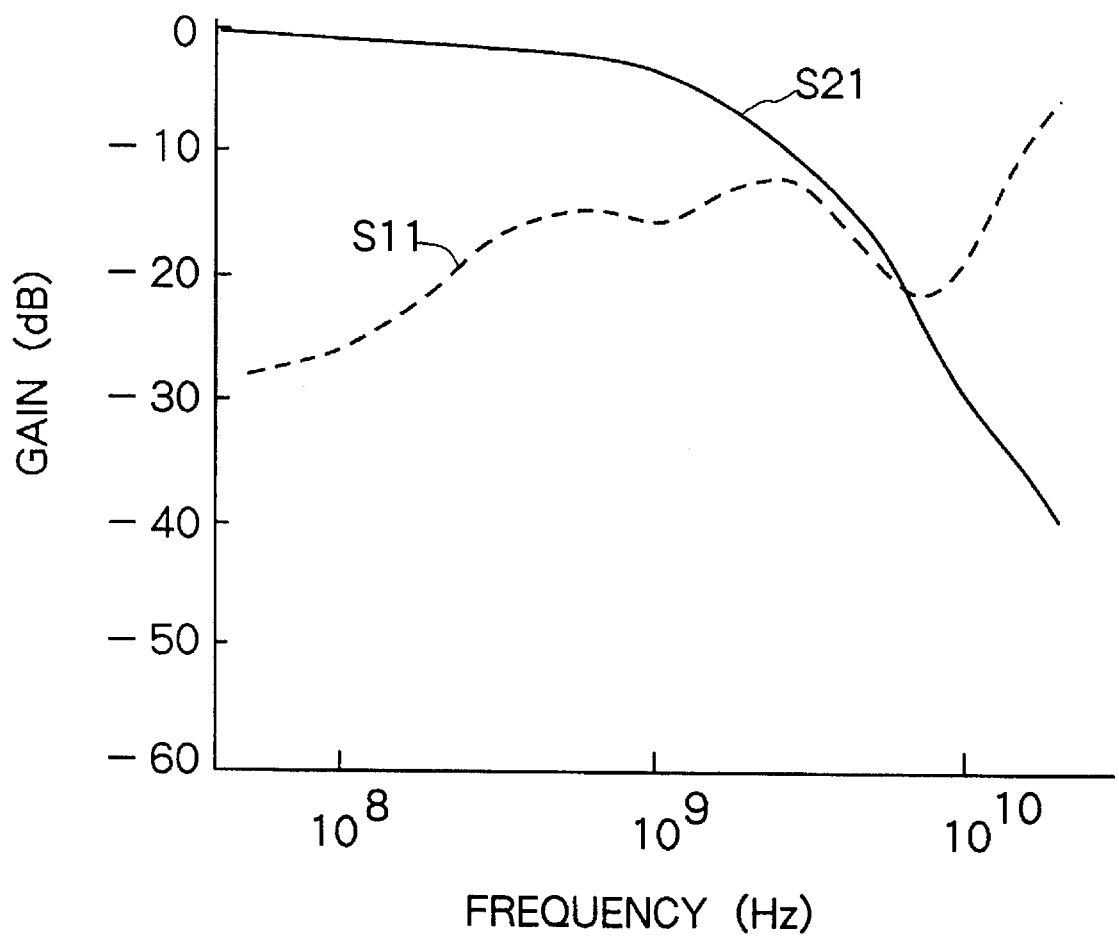
FIG. 18 shows the signal transmission characteristics of the signal transmission element shown in FIGS. 15 and 16.

FIG. 18 shows the transmission characteristics of the signal transmission element shown in FIGS. 15 to 17, in which the insulating magnetic bodies 31 and 32 are constituted with a carbonyl iron-phenol resin compound member (iron 50 vol %, particle diameter 2 μm). As shown in FIG. 18, attenuation of the transmission characteristics S21 becomes pronounced at approximately 1 GHz, and this attenuation continues up to 20 GHz, which is the upper limit in the measurement. This means that a low pass filter is constituted. As for the reflection characteristics S11, attenuation of approximately −10 dB is observed up to approximately 10 GHz, indicating that reflection is sufficiently inhibited.

Figure 19:
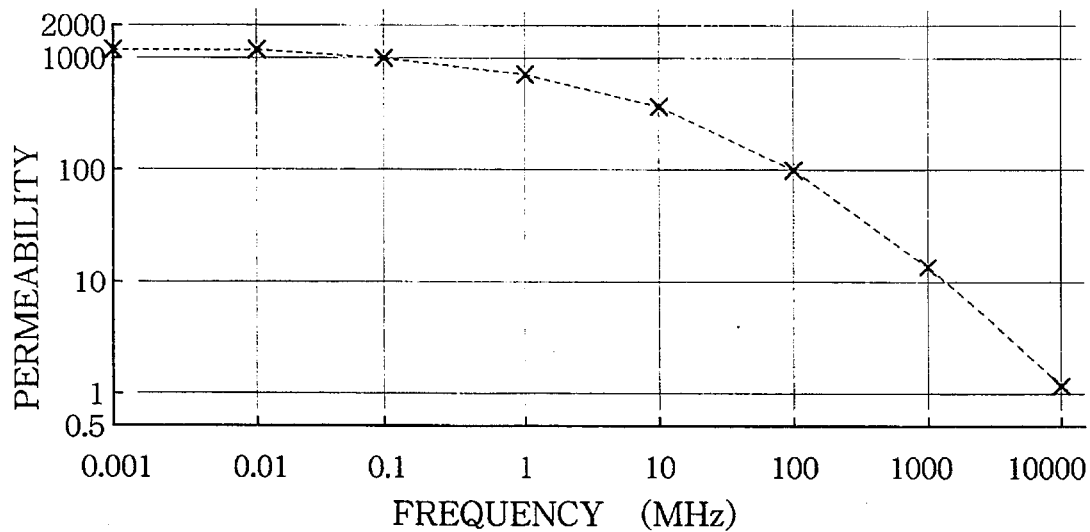
FIG. 19 shows the magnetic permeability-frequency characteristics of iron.
Figure 20:
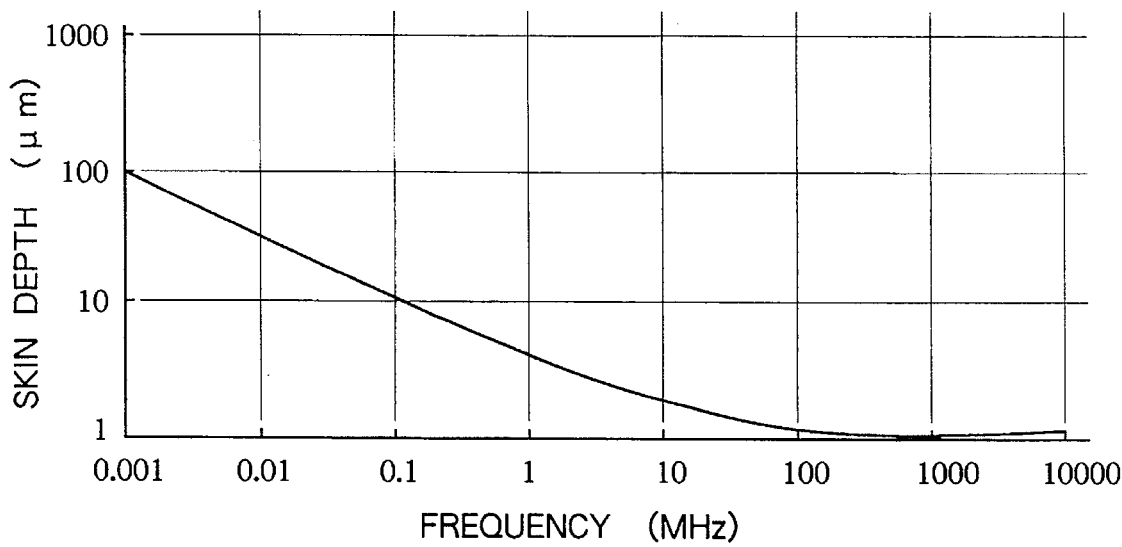
FIG. 20 shows the skin depth-frequency characteristics of iron.

It has already been mentioned that when constituting the insulating magnetic body 3 in the electronic part according to the present invention, ferromagnetic metal particles with diameters in the range of 0.01 μm to 100 μm may be used. When selecting the ideal particle size from the aforementioned particle size range, one of the most desirable means is to determine the particle size of the ferromagnetic metal particles based upon a skin depth which will allow a high frequency magnetic field within the range of operating frequencies to enter the inside of the particles. When iron is selected for the ferromagnetic particles, the conductance of iron is $1.07 \times 10^7$ S/m and the magnetic permeability produces the frequency characteristics shown in FIG. 19. The frequency characteristics of the skin depth were calculated by substituting values in the following formula to determine the skin depth d of the metal particles;

$$d = 1/(\pi f \mu \sigma)^{1/2} \quad (1)$$

with the frequency f, which can be obtained in FIG. 19, the magnetic permeability μ of iron that corresponds to the frequency f, and also the aforementioned conductance σ of iron ($1.07 \times 10^7$ S/m) and the results are shown in FIG. 20.

Since the high frequency magnetic field penetrates down to a depth which is 3 times the skin depth, if the particle diameter of the metal particles is several times that of the skin depth, the body will provide sufficient high frequency magnetic dissipation. Since, in this FIG. 20, the skin depth at 10 GHz is approximately 1 μm the diameter of a particle whose radius is 3 times the skin depth, is approximately 6 μm. Accordingly, by constituting the insulating magnetic body with metal particles with a particle diameter of approximately 6 μm or less, which are electrically insulated from one another so that no electric current can run among the particles, substantial high frequency magnetic dissipation will be achieved over a wide frequency range.

Fine particles of pure iron (carbonyl iron particle) with the particle diameter of several μm or less, which are obtained by thermally decomposing carbonyl iron would be a desirable example of such fine ferromagnetic metal particles. When these iron particles are hardened with an insulator, a body is obtained that demonstrates a high degree of dissipation over millimeter waves.

Figure 21:
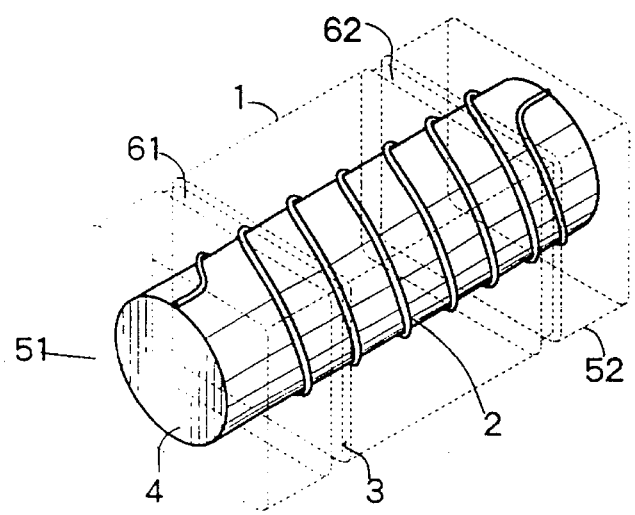
FIG. 21 is a perspective of yet another embodiment of the signal transmission element according to the present invention with the signal conductor included in the element exaggerated.
Figure 22:
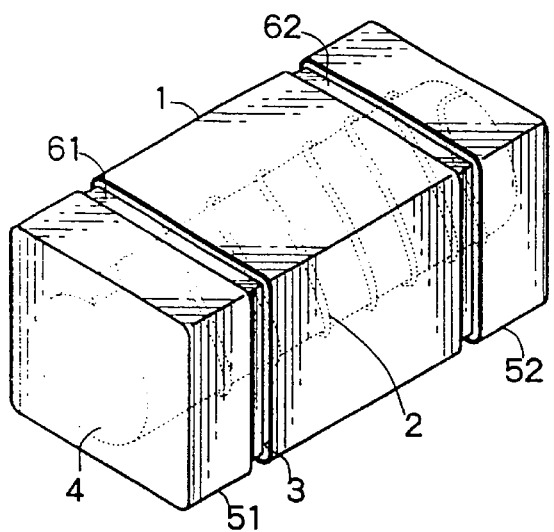
FIG. 22 is an external perspective view of the signal transmission shown in FIG. 21.
Figure 23:
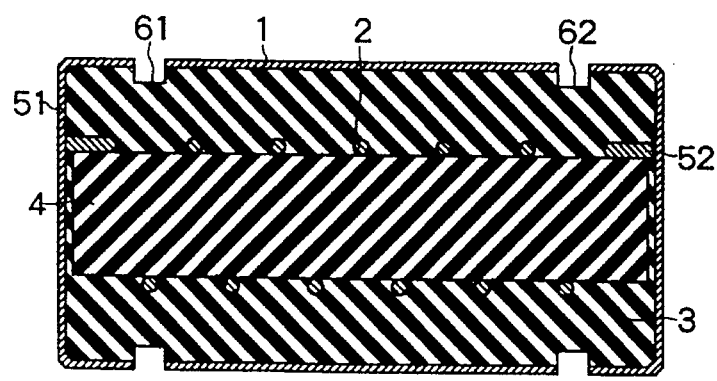
FIG. 23 is a cross section of the signal transmission element shown in FIGS. 21 and 22.
Figure 24:
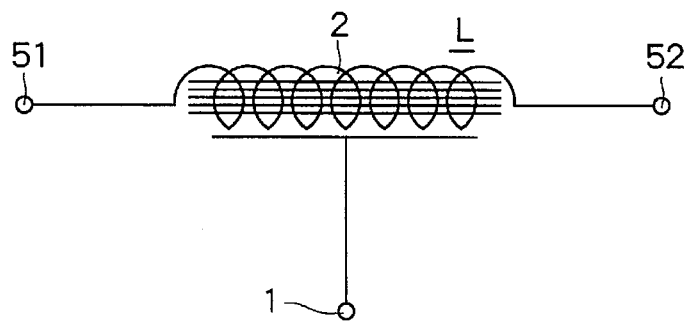
FIG. 24 is a diagram of the electrically equivalent circuit of the signal transmission shown in FIGS. 21 to 23 according to the present invention.

FIG. 21 is a perspective of yet another embodiment of the signal transmission element according to the present invention with the signal conductor included in the element exaggerated. FIG. 22 is an external perspective view of the signal transmission element shown in FIG. 21. FIG. 23 is a cross section of the signal transmission element shown in FIGS. 21 and 22 and FIG. 24 is a diagram of an equivalent circuit of the signal transmission element according to the present invention shown in FIGS. 21 to 23. The signal transmission element in these FIGS. includes at least one ground conductor 1, at least one signal conductor 2 and an insulating magnetic body 3. The ground conductor 1 is formed on a surface of the insulating magnetic body 3 and the signal conductor 2 is embedded in the insulating magnetic body 3.

The signal conductor 2 is formed spirally. This spiral signal conductor is coiled around another insulating magnetic body 4 distinct from the insulating magnetic body 3. The signal conductor 2 is coiled in such a manner that the turning angle is the same for each turn and the coil advances over intervals in the direction of the coil axis. The intervals between the turns should be longer than the diameter of the wire that constitutes the signal conductor 2.

The two ends of the signal conductor 2 are separately connected to a pair of terminal electrodes 51 and 52 which are attached to the opposite two ends of the insulating magnetic body 3. The ground conductor 1 is formed on a surface of the insulating magnetic body 3 between the pair of terminal electrodes 51 and 52 in the state in which it is electrically insulated from the terminal electrodes 51 and 52. Reference numbers 61 and 62 indicate the insulating areas. The insulation areas 61 and 62 are formed in a ring shape.

The signal transmission element shown in FIGS. 21 to 23 according to the present invention is a 3-terminal type equivalent circuit in which, as shown in FIG. 24, the line inductance generated by the signal conductor 2 is inserted between the terminal electrodes 51 and 52, and the ground conductor 1 is T-linked to the line inductance.

Since the magnetic dissipation of the signal transmission element expressed by the circuit in FIG. 24 is in proportion to the line inductance L, the dissipation is large in the frequency band in which the line impedance L is equal to or greater than the impedance output from the drive circuit (not shown), demonstrating equivalent characteristics to those of a low pass filter. However, unlike a low pass filter constituted with an ordinary low dissipation circuit element, the energy of the signal is absorbed in the element and is not reflected in the attenuation band. By inserting the signal conductor 2 inside the magnetic body 3 which is formed by insulating metal particles with small particle diameters, a signal transmission element that demonstrates large magnetic dissipation over a wide frequency range and that, at the same time, absorbs undesired frequency components, is achieved.

The signal transmission element according to the present invention is well suited to constitute a transmission line with a large dissipation and the attenuation factor is determined by the ratio against the output impedance from the drive circuit. With the frequency at which the dissipation increases defined as the cutoff frequency, as in the case of an ordinary filter, the cutoff frequency goes down in approximate proportion to the length of the line. Consequently, a structure which accommodates an electrically long line within a limited volumetric space is essential for achieving miniaturization while securing a high cutoff frequency.

In the case of the embodiment shown in FIGS. 21 to 23, as has been mentioned earlier, the signal conductor 2 is formed spirally and is coiled in such a manner that the coil advances over approximately equal intervals in the direction of the coil axis. In other words, each turn goes around in the same direction. Since this structure ensures that the magnetic fluxes generated at each turn do not cancel one another out overall, it becomes possible to form an electrically long line within a limited volumetric space and to obtain a large inductance, thereby achieving a high attenuation factor.

Next, the insulating magnetic body 3 containing carbonyl iron shows little dissipation at 1 GHz or lower, as is obvious from the dissipation frequency characteristics of carbonile iron. Therefore, when constituting an absorption type filter for this frequency band, a problem may arise of insufficient dissipation characteristics. As the means for solving this problem, in this embodiment, the spiral signal conductor 2 is coiled on the insulating magnetic body 4, as explained earlier. The insulating magnetic body 4 is constituted of an insulating magnetic material with great dissipation at 1 GHz or lower, typically a ferrite magnetic body. This structure achieves an absorption type filter which retains sufficient dissipation characteristics even in the frequency band of 1 GHz or lower.

To be more specific, the wiring material for the signal conductor 2 has a cross section diameter of 0.1 mm and is coiled 8 times around the insulating magnetic body 4 which is constituted of a ferrite dowel with a diameter of 1.2 mm. Its periphery is hardened with an insulating magnetic body 3, mainly constituted of carbonyl iron particles, to a thickness of approximately 0.3 mm, to form a rectangular parallelepiped body. After forming a film over the entirety of the outside of the rectangular parallelepiped body by electroless plating, little grooves are cut into the plate film to form insulating gaps 61, 62 in such a manner that areas 51, 52 to function as terminal conductors are left on both sides. By doing so, a signal transmission element with a 3-terminal structure (refer to FIGS. 21 to 23), provided with the ground conductor 1 in the middle and the terminal conductors 51 and 52 on either side of the ground conductor 1, which are insulated by the insulating gaps 61 and 62, is achieved. The terminal conductors 51 and 52 at both ends which are separated by the insulating gaps, are then electrically connected with the signal conductor 2 on the inside. In this manufacturing process, production is performed at a temperature of 300 or less, which means that the thermal treatment at temperatures of 1000 or higher that is required for manufacturing ceramic elements in the prior art, is not necessary. Thus, the energy required for production is greatly reduced.

Figure 25:
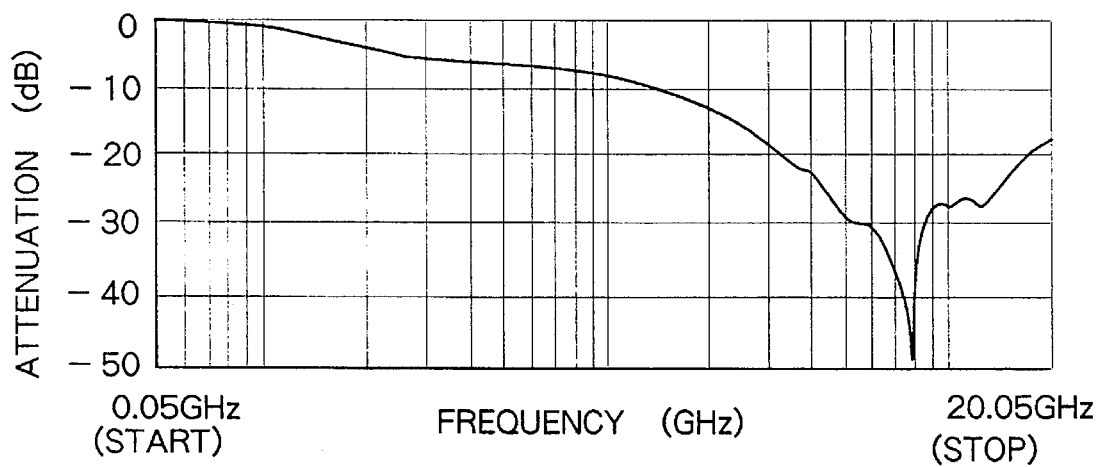
FIG. 25 shows the signal transmission characteristics of the signal transmission element shown in FIGS. 21 to 23 according to the present invention.
Figure 26:
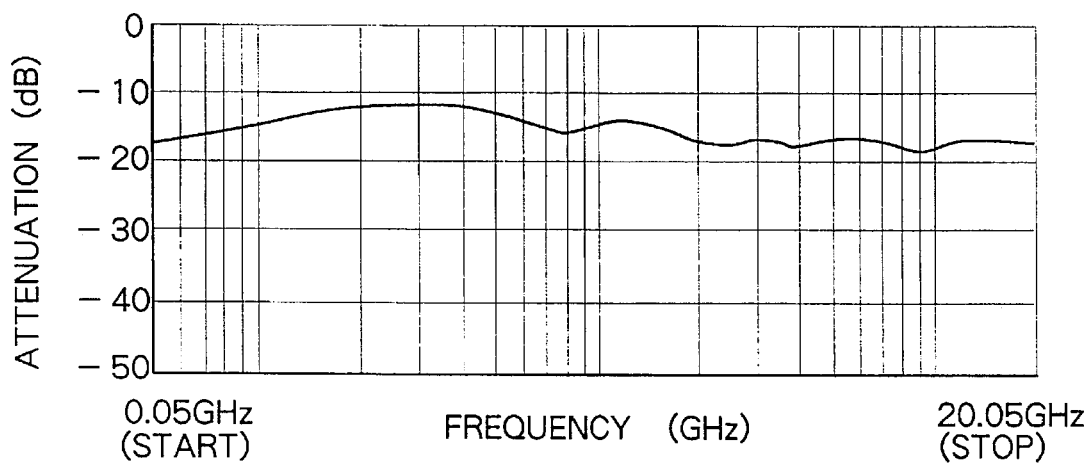
FIG. 26 shows the reflection characteristics of the signal transmission element shown in FIGS. 21 to 23 according to the present invention.

FIG. 25 shows the transmission characteristics of the signal transmission element according to the present invention and FIG. 26 shows its reflection characteristics. The transmission characteristics shown in FIG. 25 indicate that the cutoff frequency of this element, i.e., the frequency at which the attenuation is –3 dB, is approximately 165 GHz and that in the frequency range higher than the cutoff frequency, the attenuation increases as the frequency becomes higher. In the range of 4 GHz to 20 GHz, attenuation of approximately –20 dB is maintained practically constant. Also, as shown in FIG. 26, the reflection characteristics at 1 GHz or higher are –10 dB or less and are also very stable.

Figure 27:
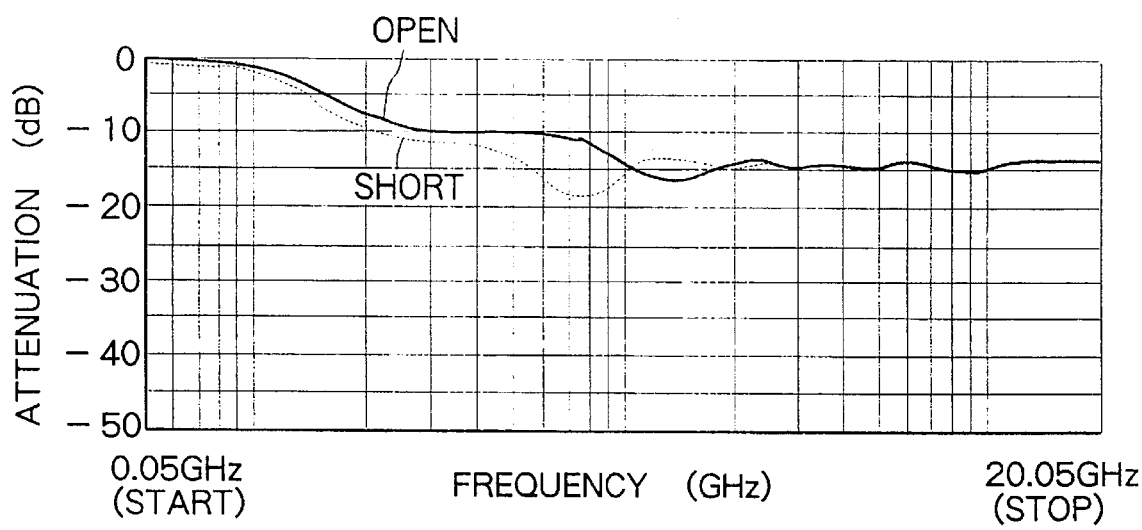
FIG. 27 shows the reflection characteristics when shorting and opening of the signal transmission element shown in FIGS. 21 to 23 according to the present invention.

Next, FIG. 27 shows the reflection characteristics for shorting and opening the signal transmission element according to the present invention. In the case of either shorting or opening, the reflection characteristics at 1 GHz or higher do not change much. This indicates that most of the energy sent into the element is absorbed inside the element when the frequency is at 1 GHz or higher. This further means that the reflection characteristics are determined by the ratio of the input impedance of the element and the impedance on the drive side and that it does not depend on the impedances within the element or on the load side.

Figure 28:
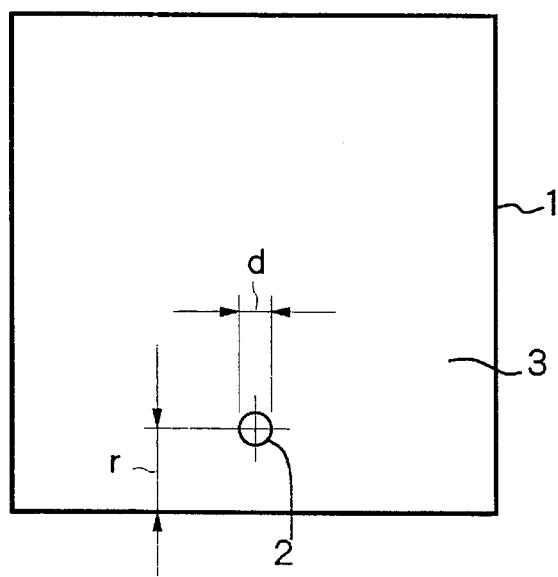
FIG. 28 is a development elevation along the transmission line with the signal transmission element shown in FIGS. 21 to 23 according to the present invention regarded as a TEM transmission line.

If the signal transmission element shown in FIGS. 21 to is to be regarded as a TEM transmission line comprising a transmission line constituted of the signal conductor 2 and a ground conductive member constituted of the ground conductor 1, its structure can be illustrated in a development along the transmission line as shown in FIG. 28. According to transmission line theory, the characteristic impedance Zo of this line can be expressed with the following formula (2)

$$Zo = (\mu_r/\epsilon_r) 60 \cos h_{-1}(d/r) \quad (2)$$

By substituting values for the various factors constituting the line described earlier, i.e., the line diameter d=0.1 mm, the line interval r=0.3 mm, the relative dielectric constant $\epsilon_r$=90 and the relative magnetic permeability $\mu_r$=9 in the equation (2) above, the characteristic impedance Zo is calculated to be 36.5 Ω. The reflection coefficient Γ when this signal transmission element is driven with the drive side impedance at 50 Ω, is calculated thus;

$$\Gamma = \{(50/36.5) - 1\}/\{((50/36.5) + 1\} \quad (3)$$
$$= 0.16$$

$$20 \log(0.16) = -16.1 \text{ dB} \quad (4)$$

Although there is a significant difference when this reflection coefficient is compared to the reflection coefficient calculated using the actual measured values in the reflection dissipation, this difference can be assumed to be caused by a reflection which occurs mainly due to the structure of the input/output terminal, which does not constitute the transmission line.

The results of the tests show that when the coil is wound 4 times, the cutoff frequency increases to 330 MHz. This means that the cutoff frequency can be arbitrarily selected with the number of times the coil is wound. As explained earlier, the characteristic impedance can be determined by selecting appropriate values for the line diameter d, the line interval r, the relative dielectric constant $\epsilon_r$ and the relative magnetic permeability $\mu_r$. Since the drive impedance is not always set at 50 Ω in an actual circuit and may sometimes exceed 100 Ω, it is a great advantage that in this signal transmission element, simply by selecting suitable values for the various factors constituting the line, impedances over a wide range of frequencies can be determined.

For the signal transmission element shown in FIGS. 21 to 23, the cutoff frequency and the characteristic impedance can also be indicated by pouring paint into the insulating gaps 61, 62 which are formed as grooves by a cutting process.

In the signal transmission element shown in FIGS. 21 to 23, since at least one ground conductor 1 and at least one signal conductor 2 are provided at the insulating magnetic body 3, a signal transmission element which performs signal transmission can be obtained in an application to a signal transmission passage by grounding the ground conductor 1 and inserting the signal conductor 2 into the signal transmission passage.

Since the insulating magnetic body 3 is constituted of a compound member in which ferromagnetic metal particles are mixed in an insulating resin, the undesired high frequency components in the high frequency range which are included in a signal passing through the signal conductor can be reliably absorbed through the absorbing effect of the insulating magnetic body 1. To be more specific, a signal transmission element which has the absorbing effect in the high frequency band of 1 GHz or higher (high frequency stopping) and which passes signals that belong in the lower frequency bands (low pass), is achieved. Also, the impedance can be maintained almost constant up to a frequency of approximately 20 GHz and reflection can be kept at approximately −10 dB. This means that the signal transmission element according to the present invention is suited to be used as a low pass filter.

In the signal transmission element in this embodiment, too, the ferromagnetic metal is used in the form of particles with their particle size in the range of 0.01 μm to 100 μm in diameter. As mentioned earlier, when selecting the ideal particle size from the aforementioned particle size range, one of the most desirable means that should be applied is to determine the particle size of the ferromagnetic metal particles based upon a skin thickness which allows high frequency magnetic fields within the range of operating frequencies to enter the inside of the particles. By doing so, the high frequency magnetic field can be ensured to penetrate fully and effectively into the ferromagnetic metal particles. As a result, the magnetic dissipation characteristics of the ferromagnetic metal particles present in the insulating magnetic body contribute to generating, greatly improving the efficiency of their use.

Furthermore, the insulating magnetic body 3 that absorbs the high frequency components is constituted of a compound member which combines ferromagnetic metal particles and an insulating resin with a ground conductor 1 and the signal conductor 2 both provided at the insulating magnetic body 3, achieving a very simple structure.

The mechanism of low frequency passing and high frequency stopping in the signal transmission element according to the present invention is almost identical to that of the signal transmission element that was explained in reference to FIGS. 1 to 14 earlier and its detailed explanation is omitted here.

Also, as has been explained, the structure of the signal transmission element according to the present invention is simple compared with that of band filters in the prior art and also the cost of basic materials is lower. In addition, it does not require processes such as firing that are energy costly. Thus, a great reduction in production cost is achieved.

Figure 29:
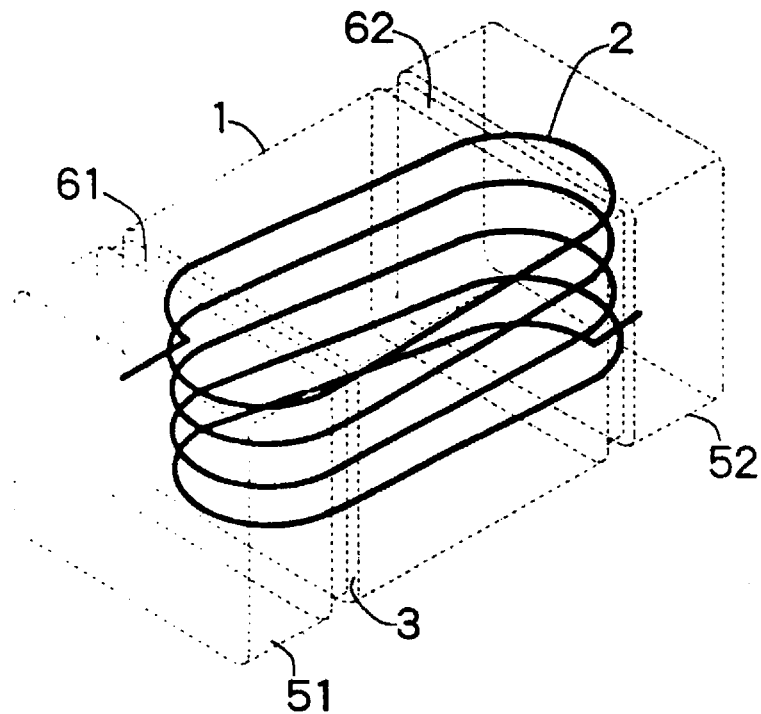
FIG. 29 is a perspective of yet another embodiment of the signal transmission element according to the present invention with the signal conductor included in the element exaggerated.
Figure 30:
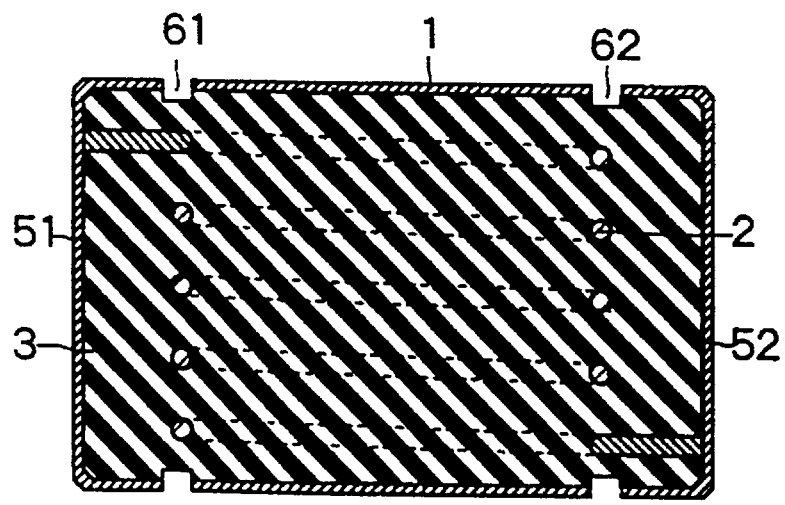
FIG. 30 is a cross section of the signal transmission element shown in FIG. 29.

There are a variety of possibilities for the structure in which a spiral signal conductor 2 is embedded inside an insulating magnetic body 3 to constitute a TEM line with a ground conductor 1 provided on the outside. For instance, as shown in FIGS. 29 and 30, the spirally formed signal conductor 2 may be embedded in such a manner that the direction of its winding is at a right angle to the direction of the terminal conductors 51 and 52. The same reference numbers are assigned to components in FIGS. 29 and 30 that are identical to those in FIGS. 21 to 23 and their detailed explanation is omitted.

EXAMPLES OF APPLICATION

Figure 31:
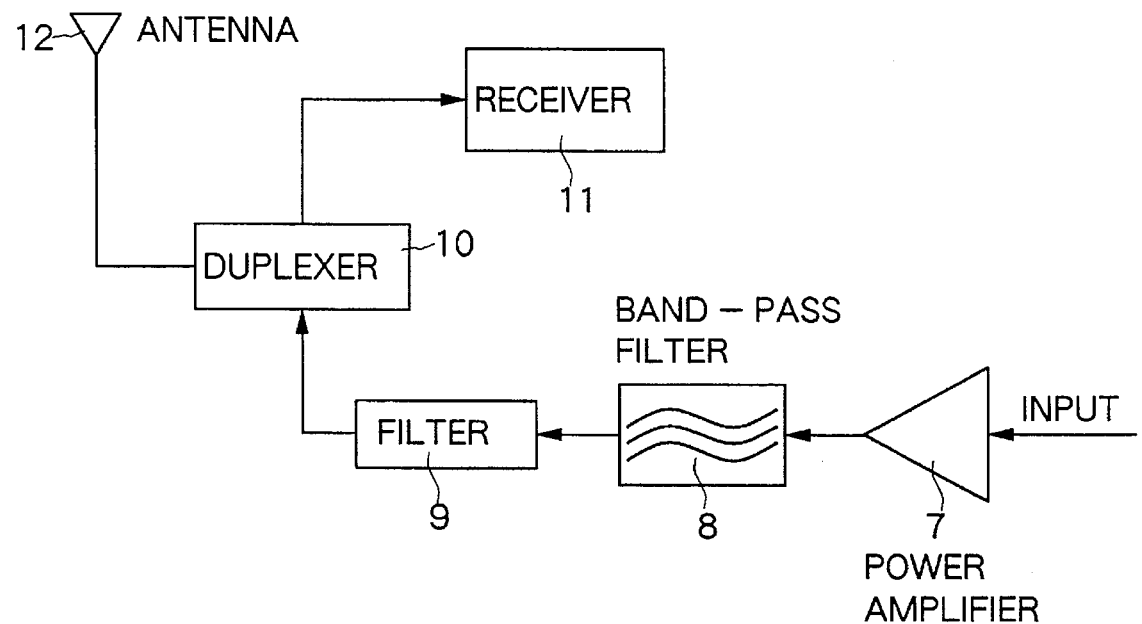
FIG. 31 shows an example of an application in which the signal transmission element shown in FIGS. 1, 9, 11 and 15 to 17, FIGS. 21 to 23
Figure 32:
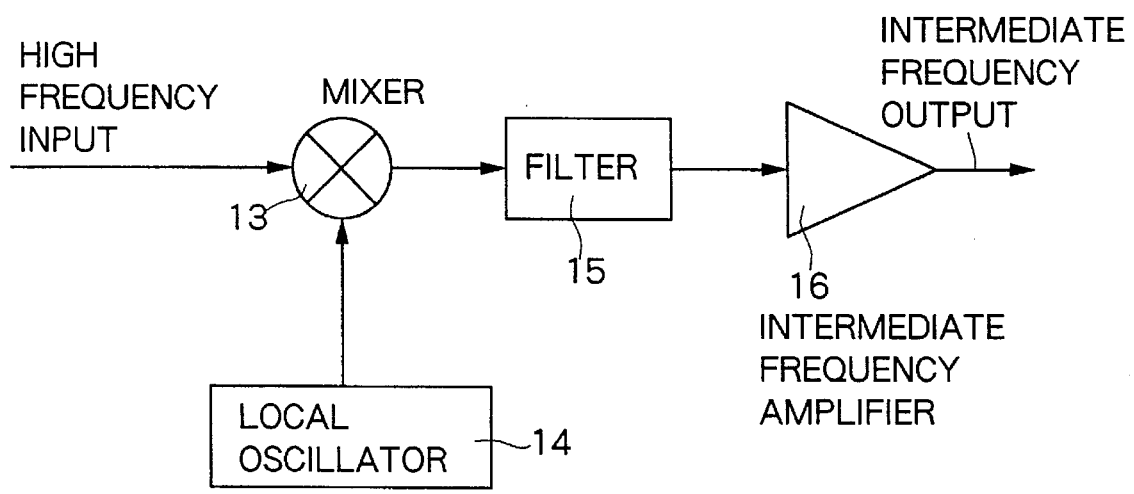
FIG. 32 shows an example of an application in which the signal transmission element shown in FIG. 1, FIGS. 9 to 11, FIGS. 15 to 17, FIGS. 21 to 23

As examples of application of the signal transmission element according to the present invention as an absorption type low pass filter, an instance of outside band characteristics improvement in a band pass filter and also an instance of undesired signal removal in an intermediate frequency amplifying circuit are explained in reference to FIGS. 31 and 32.

(a) Application example in which outside band characteristics are improved in a band pass filter.

The FIG. shows an example of an application in which the signal transmission element according to the present invention is used to improve the outside band characteristics of a band pass filter inserted in a high frequency power amplifying circuit such as a cellular phone. The signal transmission element according to the present invention is inserted as the filter 9 located behind the band pass filter 8 and in front of the duplexer 10. In FIG. 31, reference numbers 11 and 12 indicate a reception circuit and an antenna respectively.

The band pass filter 8, which is inserted in a high frequency power amplifying circuit such a cellular phone, is required to have a stopping function at frequencies that are odd-number multiples of the carrier frequency in order to stop higher harmonics generated due to distortion caused at the power amplifier 7 as well as to provide frequency selectability in the vicinity of the passing band. In a frequency range such as this, the circuit elements of the band pass filter 8 are distributed constant circuit elements and very often, they are very different from the stopping function performance in the vicinity of the carrier frequency. Consequently, in order to improve the characteristics outside the band, the stopping performance is changed sometimes to such an extend that the characteristics inside the band are affected.

In order to avoid such a problem, inserting a low pass filter which operates in the relevant frequency band may be considered, but this would increase the production costs. Alternatively, by inserting the signal transmission element according to the present invention, which has absorption characteristics in the relevant frequency band, at the position indicated in FIG. 31 as the filter 9, the problem described above can be eliminated with its absorbing effect in the higher harmonics range, without much affecting the signal at the carrier frequency. Compared with a low pass filter, the signal transmission element according to the present invention is much less costly and will not increase production costs significantly. Furthermore, as the undesired higher harmonics are effectively absorbed, circuit stabilization is achieved.

(b) Application example in which undesired signals are removed in an intermediate frequency amplifying circuit.

FIG. 32 shows an application example in which a signal transmission element according to the present invention is used as a filter for removing undesired signals in an intermediate frequency amplifying circuit. The signal transmission element according to the present invention is used as a filter 15 for the removal of undesired signals in an intermediate frequency amplifying circuit. Reference number 14 indicates a local oscillator.

A signal that has leaked from the high frequency amplifying circuit sometimes returns to be superimposed on the signal line extending from the high frequency mixer circuit 13 through the intermediate frequency amplifying circuit 16. In order to avoid problems in the intermediate frequency amplifying circuit 16 caused by such a signal, the signal transmission element according to the present invention is inserted as shown in FIG. 32 as the filter 15, whose cutoff frequency is set somewhere between the carrier frequency supplied from the local oscillator 14 and the intermediate frequency. With this, the undesired signal is absorbed inside the filter 15 constituted of the signal transmission element according to the present invention, which contributes to stabilization of the circuit operation.

Next, an embodiment in which the electronic part according to the present invention is employed as a connector is explained as a specific example.

Figure 33:
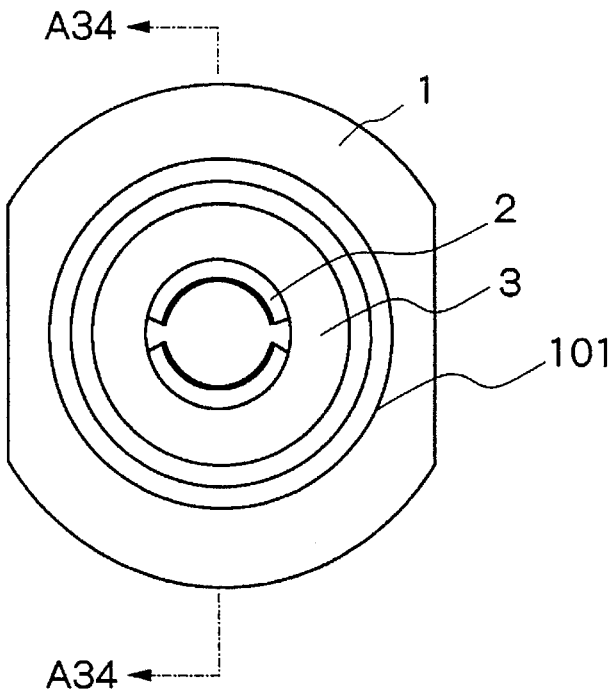
FIG. 33 is a front elevation of the connector according to the present invention.
Figure 34:
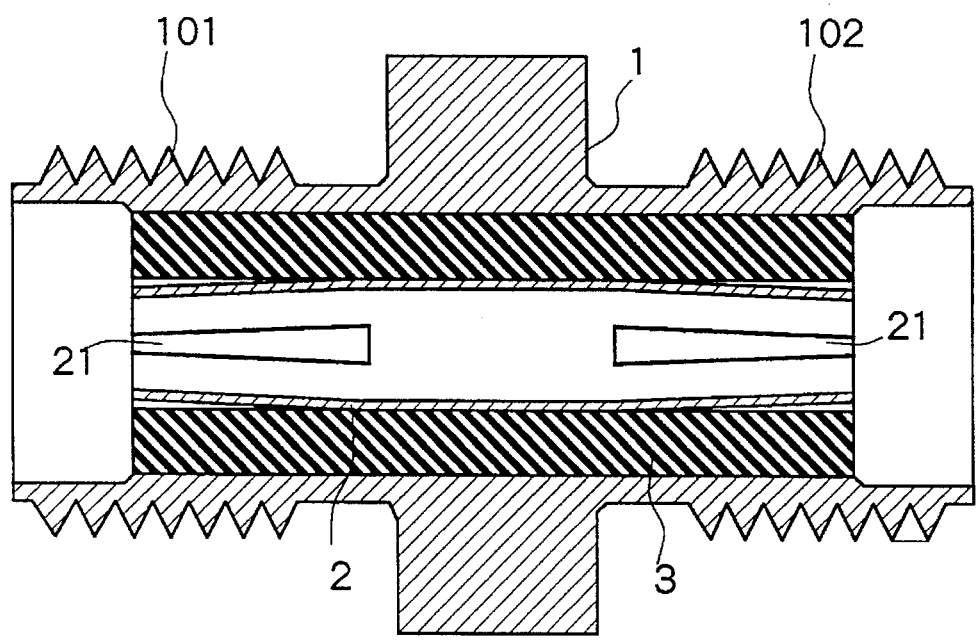
FIG. 34 is a cross section through line A34—A34 in FIG. 33.

FIG. 33 is a side elevation of the connector according to the present invention and FIG. 34 is a cross section through line A34—A34. The connector according to the invention includes, at least, a pair of conductors; a ground conductor 1 and a signal conductor 2, and an insulating magnetic body 3. The signal conductor 2 is provided in such a manner that it penetrates the insulating magnetic body 3. The ground conductor 1 is mounted on the insulating magnetic body 3 and is electrically insulated from the signal conductor 2 by the insulating magnetic body 3. As a result, a connector with a simple structure, in which the ground conductor 1 is grounded and the terminal conductor 2 is insulated from the ground conductor 1 by the insulating magnetic body 3, is achieved. The ground conductor 1 shown in the FIGS., is shaped cylindrically with its two ends forming threaded portions 101 and 102, and it is grounded via a cable or a circuit system which is connected to the threaded portions 101 and 102. The signal conductor 2 is cylindrical, with a slit 21 provided running from both ends toward the center and it has a tensile property. A pin-type connector may be connected to the signal conductor 2.

As explained earlier, the insulating magnetic body 3 is constituted of a compound material in which ferromagnetic metal particles and an insulating resin are mixed. The ferromagnetic metal particles are preferably iron, in particular, carbonyl iron, of which various particle diameters can be selected within a range of 0.01 μm to 100 μm. The insulating resin to be mixed with the ferromagnetic metal particles should be constituted of one type or several different types of the following: phenol epoxy, rubber or Teflon. Also, as explained earlier, when selecting the ideal particle size from the aforementioned particle size range one of the most desirable means that should be applied is to determine the particle size of the ferromagnetic metal particles based upon the skin depth which allows high frequency magnetic fields within the range of operating frequencies to enter the inside of the particles.

Now, the method for producing the connector according to the present invention and the characteristics of the specimens thus obtained are described. First, ferromagnetic metal particles and insulating resin were mixed and a specimen of the insulating magnetic body for an SMA 3.5 mm connector was formed by pressing. Then, an insulating magnetic body 3 was obtained by hardening the insulating resin with an appropriate thermal treatment on the specimen. The insulating magnetic body 3 was then impregnated with the resin and was dried and hardened.

Next, the insulating magnetic body 3 was inserted in a ground conductor 1, which was then followed by insertion of a signal conductor 2 into the insulating magnetic body 3 to constitute an SMA 3.5 mm connector. At this point, the thickness of the signal conductor 2 should be adjusted so that the characteristic impedance is set to 50 Ω, For instance, when the length L1 of the insulating magnetic body 3 is 10 mm, the diameter $\Phi 1$ of the signal conductor 2 should be within the range of 0.1 to 1.0 mm.

The characteristics of the connector described above were evaluated for the complex magnetic permeability and the complex dielectric constant of the compound material constituting the insulating magnetic body 3 and the transmission characteristics S11 and S21 of the connector. Since the method of evaluation employed here is identical to that used in evaluating the signal transmission element in FIG. 1, its detailed explanation is omitted. Also, the ferromagnetic metal particles used for this connector were identical to those used for the signal transmission element shown in FIG. 1, exhibiting complex magnetic permeability characteristics for the iron-phenol resin compound material identical to those shown in FIG. 2 and complex dielectric characteristics for the iron-phenol resin compound material identical to those shown in FIG. 3. Therefore, descriptions of these characteristics are omitted here.

Furthermore, since the transmission characteristics in discussion here, too, are identical to transmission characteristics S11 and S21 shown in FIG. 6 when the iron-phenol resin compound material was used, a detailed explanation of that is also omitted. As explained earlier, in reference to FIG. 6, in the connector in this embodiment, attenuation of the transmission characteristics S21 becomes pronounced at approximately 1 GHz, and this attenuation continues up to 20 GHz, which is the upper limit in the measurement. This means that high frequency noise is absorbed. As for the reflection characteristics S11, attenuation of −10 dB is observed up to approximately 10 GHz, indicating that reflection is sufficiently inhibited.

Table 2 shows the overall results of the evaluation of the transmission characteristics of the various connectors specimens numbered 1/T2 to 38/T2 which were prepared by using iron for the ferromagnetic metal particles and also by changing the particle diameter and the iron content. The transmission characteristics S11 and S12 were evaluated according to gain in the transmission characteristics S11 and S21 in various cases with the frequency in the passing range at 100 MHz and the frequency in the stopping range at 5 GHz. Phenol, acrylic, Teflon and epoxy resins were used for the insulating resin as appropriate.

TABLE 2

| No. | iron particle size μm | iron content vol % | transmission gain (S21) dB 100 MHz | 5 GHz | reflection gain (S11) dB 100 MHz | 5 GHz | insulation resistance Ω | resin |
|---|---|---|---|---|---|---|---|---|
| 1/T2 | 0.005 | 30 | −0.3 | −20 | −20 | −5 | >$10^{11}$ | phenol *1 |
| 2/T2 | 0.01 | 40 | −0.2 | −28 | −25 | −11 | >$10^{11}$ | phenol |
| 3/T2 | 0.1 | 60 | −0.2 | −30 | −25 | −12 | >$10^{11}$ | phenol |
| 4/T2 | 0.5 | 60 | −0.2 | −34 | −25 | −12 | >$10^{11}$ | phenol |
| 5/T2 | 1 | 60 | −0.2 | −39 | −26 | −12 | >$10^{11}$ | epoxy |
| 6/T2 | 2 | 60 | −0.2 | −39 | −26 | −12 | >$10^{11}$ | epoxy |
| 8/T2 | 3 | 60 | −0.2 | −41 | −24 | −12 | >$10^{11}$ | epoxy |
| 9/T2 | 5 | 60 | −0.2 | −41 | −25 | −12 | >$10^{11}$ | epoxy |
| 10/T2 | 10 | 60 | −0.2 | −43 | −25 | −12 | >$10^{11}$ | epoxy |
| 11/T2 | 30 | 60 | −0.2 | −43 | −26 | −11 | $10^{10}$ | epoxy |

TABLE 2-continued

| No. | iron particle size μm | iron content vol % | transmission gain (S21) dB 100 MHz | transmission gain (S21) dB 5 GHz | reflection gain (S11) dB 100 MHz | reflection gain (S11) dB 5 GHz | insulation resistance Ω | resin |
|---|---|---|---|---|---|---|---|---|
| 12/T2 | 50 | 60 | −0.2 | −43 | −26 | −12 | $10^{10}$ | epoxy |
| 13/T2 | 100 | 60 | −0.3 | −35 | −25 | −10 | $10^{9}$ | epoxy |
| 14/T2 | 200 | 60 | −1.3 | −20 | −15 | −8 | $10^{9}$ | epoxy *2 |
| 15/T2 | 1 | 10 | −0.2 | −10 | −25 | −8 | $>10^{11}$ | epoxy |
| 16/T2 | 1 | 20 | −0.2 | −12 | −25 | −11 | $>10^{11}$ | epoxy |
| 17/T2 | 1 | 30 | −0.2 | −30 | −24 | −12 | $>10^{11}$ | epoxy |
| 18/T2 | 1 | 40 | −0.2 | −34 | −25 | −12 | $>10^{11}$ | epoxy |
| 19/T2 | 1 | 50 | −0.2 | −40 | −24 | −12 | $>10^{11}$ | epoxy |
| 20/T2 | 1 | 55 | −0.2 | −43 | −26 | −11 | $>10^{11}$ | epoxy |
| 21/T2 | 1 | 63 | −0.2 | −45 | −25 | −12 | $>10^{11}$ | epoxy |
| 22/T2 | 1 | 65 | −0.2 | −40 | −23 | −10 | $10^{10}$ | epoxy |
| 23/T2 | 1 | 70 | −0.2 | −35 | −23 | −10 | $10^{10}$ | epoxy |
| 24/T2 | 1 | 75 | −0.2 | −25 | −23 | −10 | $10^{9}$ | epoxy |
| 25/T2 | 1 | 80 | −0.4 | −25 | −23 | −8 | $10^{9}$ | epoxy |
| 26/T2 | 1 | 90 | −1.2 | −20 | −25 | −5 | $10^{9}$ | epoxy *1 |
| 27/T2 | 10 | 10 | −0.2 | −10 | −22 | −9 | $10^{11}$ | phenol |
| 28/T2 | 10 | 20 | −0.2 | −12 | −25 | −9 | $10^{11}$ | phenol |
| 29/T2 | 10 | 30 | −0.2 | −30 | −24 | −10 | $10^{11}$ | rubber |
| 30/T2 | 10 | 40 | −0.2 | −35 | −24 | −10 | $10^{11}$ | rubber |
| 31/T2 | 10 | 50 | −0.2 | −38 | −25 | −10 | $10^{11}$ | rubber |
| 32/T2 | 10 | 55 | −0.2 | −40 | −26 | −10 | $10^{11}$ | rubber |
| 33/T2 | 10 | 63 | −0.2 | −40 | −25 | −10 | $10^{11}$ | phenol |
| 34/T2 | 10 | 65 | −0.2 | −37 | −22 | −10 | $10^{10}$ | phenol |
| 35/T2 | 10 | 70 | −0.2 | −37 | −24 | −9 | $10^{10}$ | epoxy |
| 36/T2 | 10 | 75 | −0.4 | −27 | −25 | −10 | $10^{9}$ | epoxy |
| 37/T2 | 10 | 80 | −1.0 | −27 | −23 | −8 | $10^{9}$ | epoxy |
| 38/T2 | 10 | 90 | −1.5 | −20 | −21 | −5 | $10^{9}$ | epoxy *1 |

*1: irregular dispersion
*2: occurrence of roughness

The specimens numbered 2/T2 to 13/T2, 17/T2 to 23/T2 and 29/T2 to 35/T2 which contain iron particles whose diameters are within the range of 0.01 μm to 100 μm at a content range of 30 vol % to 70 vol % show a transmission gain S21 of (−0.1 dB) or (−0.3 dB) at the passing band frequency of 100 MHz, and show a transmission gain S21 of (−28 dB) to (−60 dB) at the stopping band frequency of 5 GHz. This means that attenuation is small at the passing band frequency of 100 MHz and is large at the stopping band frequency of 5 GHz. The reflection gain S11 is within the range of (−23 dB) to (−27dB) at the passing band frequency of 100 MHz and is within the range of (−9 db) to (−12 dB) at the stopping band frequency of 5 GHz.

In comparison, the specimen numbered 1/T2, which contains iron particles whose diameter is 0.005 μm, the specimen numbered 14/T2, which contains iron particles whose diameter is 200 μm and the specimens numbered 15/T2, 16/T2, 24/T2 to 28/T2 and 36/T2 to 38/T2 whose iron particle contents are not within the range of 30 vol % through 70 vol %, are shown to be inferior in either the transmission gain S21 or in the reflection gain S11 at 100 MHz frequency in the passing range and at 5 GHz frequency in the stopping range.

This leads to the conclusion that it is desirable to use iron particles whose particle diameters are within the range of 0.01 μm to 100 μm at an iron content in the range of 30 vol % to 70 vol %. In particular, the specimens numbered 3/T2 to 10/T2, 19/T2 to 21/T2 and 31/T2 to 33/T2 which contain iron particles whose diameters are within the range of 0.1 μm to 10 μm at a content range of 50 vol % to 63 vol % show a transmission gain S21 of (−0.1 dB) at the passing band frequency of 100 MHz, and show a transmission gain S21 of (−54 dB) to (−60 dB) at the stopping band frequency of 5 GHz. This means that attenuation is small at the passing band frequency of 100 MHz and is large at the stopping band frequency of 5 GHz. The reflection gain S11 is within the range of (−24 dB) to (−26 dB) at the passing band frequency of 100 MHz and is within the range of (−10 dB) to (−12 dB) at the stopping band frequency of 5 GHz, demonstrating that a connector with stable filter characteristics, superior low pass characteristics and high frequency stopping is achieved. Therefore, the more desirable range of particle diameters for the ferromagnetic metal particles is 0.1 μm to 10 μm and the more desirable content range for the ferromagnetic metal particles is 50 vol % to 63 vol %. Note that no significant difference in the characteristics attributable to specific types of insulating resins employed is evident.

The present invention may be applied to connectors with different structures such as a connector provided with a plurality of terminal conductors. As specific examples to which the present invention can be applied, multiple pin type connectors in the prior art disclosed in Japanese Examined Patent Publication No. 108/1986 and Japanese Examined Patent Publication No. 49661/1990 can be cited. By constituting the noise filter element or the insulating housing used in those multiple pin connectors in the known art with the insulating magnetic body disclosed in the present invention, multiple pin connectors with high frequency stopping and low pass characteristics can be obtained to ensure that the high frequency components in the high frequency range are reliably absorbed.

Figure 35:
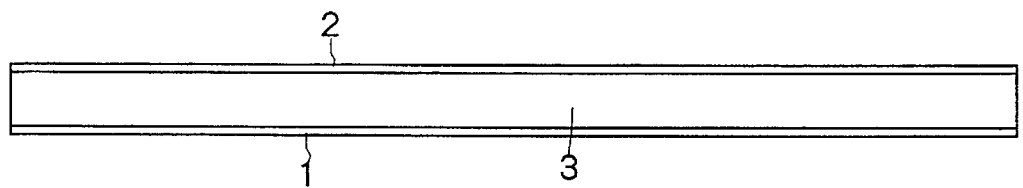
FIG. 35 is a front elevation of the circuit board according to the present invention.

Next, as a specific example of application, an embodiment in which the electronic part according to the present invention is employed as a circuit board is explained in reference to FIG. 35. The circuit board according to the present invention includes, at least, two conductors 1 and 2 and an insulating magnetic body 3. The conductors 1 and 2 are provided on the opposite sides of the insulating magnetic body 3 so as to sandwich the insulating magnetic body 3. Consequently, the conductor 1 may be used, for instance, as a ground conductor and the conductor 2 may be used as a signal conductor. In an actual operating situation, the conductor 2 is patterned to serve as the signal conductor to be used in a circuit board. For the conductors 1 and 2, known materials from the prior art is used as the material for conductor pattern formation in circuit boards, typically, a material whose main component is copper.

As explained earlier, the insulating magnetic body 3 is constituted of a compound material in which ferromagnetic metal particles and an insulating resin are mixed. The ferromagnetic metal particles should be, preferably, iron and in particular, carbonile iron. Various different particle diameters can be selected within a range of 0.01 μm to 100 μm, using either iron or carbonile iron, and the insulating resin to be mixed with the ferromagnetic metal particles may be constituted of one type or several different types of the following: phenol, epoxy, rubber and Teflon. Also, as explained earlier, when selecting the ideal particle size from the aforementioned particle size range, one of the most desirable means that should be applied is to determine the particle size of the ferromagnetic metal particles based upon the skin depth which allows high frequency magnetic fields within the range of operating frequencies to enter the inside of the particles. However, note that when constituting a circuit board, from the viewpoint of reinforcing mechanical strength, it is preferable to add fiber such as in fiberglass to the material that has, as its main component, the insulating resin described above.

Figure 36:
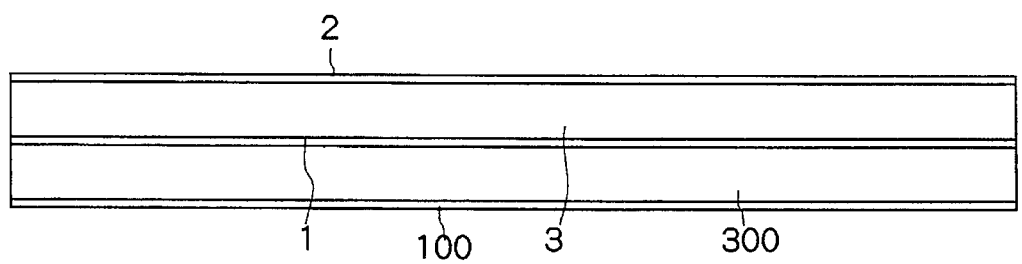
FIG. 36 is a side elevation of another embodiment of the circuit board according to the present invention.

FIG. 36 is a side elevation of another embodiment of the circuit board according to the present invention. In this embodiment, the conductors 1 and 2 are provided on the opposite sides of the insulating magnetic body 3 so as to sandwich it, another insulating magnetic body 300 is provided on top of the conductor 1 and a conductive layer 100 is provided on the insulating magnetic body 300, to constitute a circuit board with a multilayer structure. Although it is desirable to constitute the insulating magnetic body 300 with the compound material described earlier, it may also be constituted with another insulating material of the known art.

Now, the method for manufacturing the circuit board according to the present invention and the characteristics of the specimens thus obtained are explained. First, ferromagnetic metal particles and an insulating resin are dissolved in a solvent. The viscosity of this solution should be adjusted to a suitable value. The solution thus obtained is then soaked in a glass fiber and then it is dried to produce a thin sheet. Several tens of such sheets are then laminated together and on both surfaces of the resulting laminated body, copper foil is laminated. Then, a heat pressing treatment is performed on this laminated body. As the insulating resin becomes thermally hardened, the entire body is hardened. After this, a laminated copper-coated board 100 mm long, L1, 100 mm wide, W1 and 10.635 m thick, H is obtained.

Figure 37:
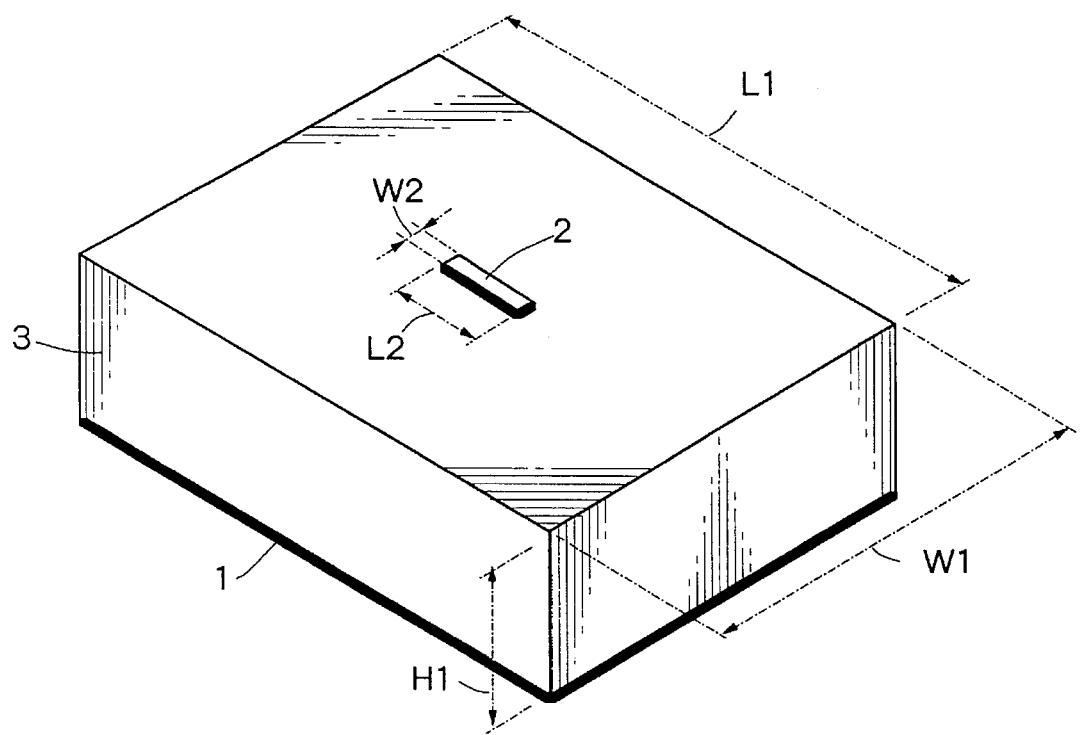
FIG. 37 is a perspective of the circuit board according to the present invention.

Then, the copper foil coatings on the two opposite surfaces of the insulating magnetic body 3 are patterned as shown in FIG. 37 by going through such processes as photo etching, to form the ground conductor 1 and the signal conductor 2. The line width W2 and the line length L2 of the signal conductor 2 are determined so that the characteristic impedance of 50 Ω is achieved in the low frequency range. In the embodiment, by taking into consideration the relative magnetic permeability and the relative dielectric constant of the compound material, a linear pattern with the line width W2, of 0.5 mm to 1.0 mm and a line length L2, of 10 mm was provided. The signal conductor 2 was formed by etching the copper foil. Alternatively, the ground conductor 1 and the signal conductor 2 may be formed through vacuum deposition.

In order to evaluate the characteristics of the circuit board described above, the transmission characteristics S11 and S21 of the compound material constituting the insulating magnetic body 3 were used. NiZn ferrite which is usually used for filters is used as a reference material. The characteristics of the connector described above were evaluated on the complex magnetic permeability and the complex dielectric constant of the compound material constituting the insulating magnetic body 3 and the transmission characteristics S11 and S21 of the connector. Since the method of evaluation employed here is identical to that used in evaluating the signal transmission element in FIG. 1, its detailed explanation is omitted. Also, the ferromagnetic metal particles used were identical to those used for the signal transmission element shown in FIG. 1 exhibiting complex magnetic permeability characteristics of the iron-phenol resin compound material identical to those in FIG. 2 and exhibiting complex dielectric characteristics of the iron-phenol resin compound material identical to those in FIG. 3. Therefore, their detailed descriptions are omitted here.

Figure 38:
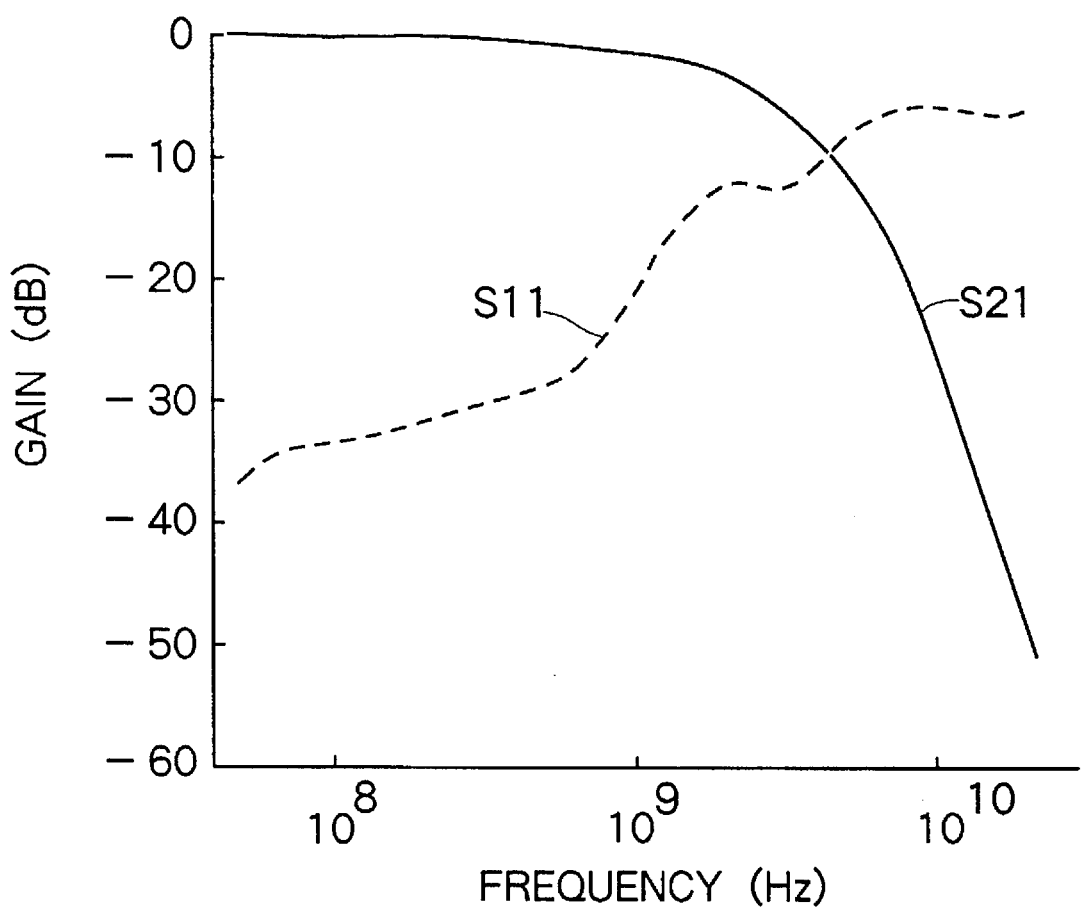
FIG. 38 shows the transmission characteristics of the circuit board shown in FIG. 37.

FIG. 38 shows the transmission characteristics achieved in the embodiment described above. As shown in the FIG., in this embodiment, too, attenuation of the transmission characteristics S21 becomes pronounced at approximately 1 GHz, and this attenuation continues up to 20 GHz, which is the upper limit in the measurement. This means that the high frequency noise is absorbed. As for the reflection characteristics S11, attenuation of −10 dB is observed up to approximately 10 GHz, indicating that the reflection is sufficiently inhibited. Table 3 shows the overall results of the evaluation of the transmission characteristics of the various specimens numbered 1/T3 to 38/T3 which were prepared by using iron for the ferromagnetic metal particles and also by changing the particle diameter and iron content. The transmission characteristics S11 and S21 were evaluated by gains of the transmission characteristics S11 and S21 in various cases with the frequency in the passing range at 100 MHz and the frequency in the stopping range at 5 GHz. Phenol, epoxy and rubber resins were used for the insulating resin as appropriate.

TABLE 3

| No. | iron particle size μm | iron content vol % | transmission gain (S21) dB 100 MHz | 5 GHz | reflection gain (S11) dB 100 MHz | 5 GHz | resin | note |
|---|---|---|---|---|---|---|---|---|
| 1/T3 | 0.005 | 30 | −0.2 | −40 | −20 | −5 | acrylic | *1 |
| 2/T3 | 0.01 | 40 | −0.1 | −52 | −24 | −11 | acrylic | |

TABLE 3-continued

| No. | iron particle size μm | iron content vol % | transmission gain (S21) dB 100 MHz | 5 GHz | reflection gain (S11) dB 100 MHz | 5 GHz | resin | note |
|---|---|---|---|---|---|---|---|---|
| 3/T3 | 0.1 | 60 | −0.1 | −55 | −25 | −12 | acrylic | |
| 4/T3 | 0.5 | 60 | −0.1 | −55 | −25 | −11 | acrylic | |
| 5/T3 | 1 | 60 | −0.1 | −55 | −24 | −12 | acrylic | |
| 6/T3 | 2 | 60 | −0.1 | −54 | −25 | −11 | teflon | |
| 8/T3 | 3 | 60 | −0.1 | −60 | −25 | −12 | teflon | |
| 9/T3 | 5 | 60 | −0.1 | −60 | −25 | −12 | teflon | |
| 10/T3 | 10 | 60 | −0.1 | −60 | −25 | −12 | phenol | |
| 11/T3 | 30 | 60 | −0.1 | −60 | −26 | −12 | phenol | |
| 12/T3 | 80 | 60 | −0.1 | −60 | −26 | −12 | phenol | |
| 13/T3 | 100 | 60 | −0.2 | −55 | −25 | −11 | phenol | |
| 14/T3 | 200 | 60 | −1.0 | −40 | −15 | −9 | phenol | *2 |
| 15/T3 | 1 | 10 | −0.1 | −20 | −25 | −9 | epoxy | |
| 16/T3 | 1 | 20 | −0.1 | −22 | −25 | −11 | epoxy | |
| 17/T3 | 1 | 30 | −0.1 | −40 | −24 | −12 | epoxy | |
| 18/T3 | 1 | 40 | −0.1 | −43 | −25 | −10 | epoxy | |
| 19/T3 | 1 | 50 | −0.1 | −55 | −24 | −11 | epoxy | |
| 20/T3 | 1 | 55 | −0.1 | −55 | −26 | −11 | epoxy | |
| 21/T3 | 1 | 63 | −0.1 | −60 | −25 | −12 | epoxy | |
| 22/T3 | 1 | 65 | −0.1 | −55 | −23 | −11 | epoxy | |
| 23/T3 | 1 | 70 | −0.1 | −50 | −23 | −12 | phenol | |
| 24/T3 | 1 | 75 | −0.1 | −48 | −23 | −10 | phenol | |
| 25/T3 | 1 | 80 | −0.2 | −45 | −23 | −9 | phenol | |
| 26/T3 | 1 | 90 | −1.0 | −40 | −24 | −3 | phenol | *1 |
| 27/T3 | 10 | 10 | −0.1 | −20 | −23 | −9 | phenol | |
| 28/T3 | 10 | 20 | −0.1 | −24 | −24 | −9 | phenol | |
| 29/T3 | 10 | 30 | −0.1 | −30 | −24 | −10 | phenol | |
| 30/T3 | 10 | 40 | −0.1 | −50 | −24 | −11 | phenol | |
| 31/T3 | 10 | 50 | −0.1 | −55 | −25 | −10 | acrylic | |
| 32/T3 | 10 | 55 | −0.1 | −60 | −26 | −10 | acrylic | |
| 33/T3 | 10 | 63 | −0.1 | −60 | −25 | −12 | acrylic | |
| 34/T3 | 10 | 65 | −0.1 | −50 | −24 | −10 | acrylic | |
| 35/T3 | 10 | 70 | −0.1 | −50 | −27 | −9 | acrylic | |
| 36/T3 | 10 | 75 | −0.1 | −50 | −25 | −10 | acrylic | |
| 37/T3 | 10 | 80 | −0.8 | −45 | −24 | −8 | acrylic | |
| 38/T3 | 10 | 90 | −1.5 | −40 | −22 | −5 | acrylic | |

*1: irregular dispersion
*2: occurrence of roughness

The specimens numbered 2/T3 to 13/T3, 17/T3 to 23/T3 and 29/T3 to 35/T3 which contain iron particles whose diameters were within the range of 0.01 μm to 100 μm, at a content range of 30 vol % to 70 vol % showed transmission gains S21 of (−0.2 dB) to (−0.3 dB) at the passing band frequency of 100 MHz, and showed transmission gains of (−28 dB) to (−60 dB) at the stopping band frequency of 5 GHz. This means that attenuation is small at the passing band frequency of 100 MHz and is large at the stopping band frequency of 5 GHz. The reflection gain S11 was within the range of (−22 dB) to (−27 dB) at the passing band frequency of 100 MHz and was within the range of (−9 db) to (−12 dB) at the stopping band frequency of 5 GHz. An insulating resistance of 109 or over was achieved, presenting no problems in insulation.

In comparison, the specimen numbered 1/T3, which contained iron particles whose diameter was 0.005 μm, the specimen numbered 14/T3, which contained iron particles whose diameter was 200 μm and the specimens numbered 15/T3, 16/T3, 24/T3 to 28/T3 and 36/T3 contents were not within the range of 30 vol % through 70 vol % were shown either to be inferior in transmission gain S21 or reflection gain S11 at 100 MHz frequency in the passing range and 5 GHz of the frequency in the stopping range. Therefore, the desirable range for particle diameter of the ferromagnetic metal particles is 0.01 μm to 100 μm and the desirable content range of the ferromagnetic metal particles is 30 vol % to 70 vol %. Note that no significant difference in the characteristics attributable to specific types of insulating resins employed was evident.

While the invention has been particularly shown and described with reference to preferred embodiments thereof, it will be understood by those skilled in the art that various changes in form and detail may be made therein without departing from the spirit, scope and teaching of the invention.

What is claimed is:

1. An electronic part used as a signal transmission element, comprising:

at least one ground conductor;

at least one signal conductor; and an insulating magnetic body, wherein each of said conductors is in contact with said insulating magnetic body and said insulating magnetic body includes a compound member in which ferromagnetic metal particles and an insulating resin are mixed; and said ground conductor is provided on a surface of said insulating magnetic body and said signal conductor is embedded in said insulating magnetic body; and said signal conductor is formed spirally.

2. An electronic device according to claim 1, wherein the particle diameter of said ferromagnetic metal particles is within a range of 0.01 μm to 100 μm.

3. An electronic part according to claim 1, wherein the particle diameter of said ferromagnetic metal particles is determined based upon a skin depth that allows high frequency magnetic fields with the range of operating frequencies to enter said particles.

4. An electronic part according to claim 1, wherein the content of said ferromagnetic metal particles is within a range of 30 vol % to 70 vol %.

5. An electronic part according to claim 1, wherein said insulating resin is constituted of at least one of epoxy, phenol, rubber, acrylic or Teflon.

6. An electronic device according to claim 1 that is used as a low pass filter.

7. An electronic part according to claim 1, wherein said signal conductor is coiled on another insulating magnetic body distinct from said insulating magnetic body.

8. An electronic device as set forth in claim 1, wherein said compound member substantially absorbs frequency components of a signal propagating through said signal conductor and said absorption approximately occurs in the frequency range of 1 GHz to 20 GHz or higher.

9. An electronic part used as a signal transmission element, comprising:
  at least one ground conductor;
  at least one signal conductor; and
  an insulating magnetic body, wherein each of said conductors is in contact with said insulating magnetic body and said insulating magnetic body includes a compound member in which ferromagnetic metal particles and an insulating resin are mixed;
  said ground conductor is provided on a surface of said insulating magnetic body and said signal conductor is embedded in said insulating magnetic body; and
  two ends of said signal conductor are connected to a pair of terminal conductors that are formed on two opposing ends of said insulating magnetic body, and said ground conductor is formed on a surface of said insulating magnetic body between said pair of terminal conductors in a state in which said ground conductor is insulated electrically from said terminal conductors.

10. An electronic part according to claim 9, wherein the particle diameter of said ferromagnetic metal particles is within a range of 0.01 μm to 100 μm.

11. An electronic part according to claim 9, wherein the particle diameter of said ferromagnetic metal particles is determined based upon a skin depth that allows high frequency magnetic fields within the range of operating frequencies to enter said particles.

12. An electronic part according to claim 9, wherein the content of said ferromagnetic metal particles is within a range of 30 vol % to 70 vol %.

13. An electronic part according to claim 9, wherein said insulating resin is constituted of at least one of epoxy, phenol, rubber, acrylic or Teflon.

14. An electronic device according to claim 9 that is used as a low pass filter.

15. An electronic part according to claim 9, wherein said signal conductor is coiled on another insulating magnetic body distinct from said insulating magnetic body.

16. An electronic part as set forth in claim 9, wherein said compound member substantially absorbs frequency components of a signal propagating through said signal conductor and said absorption approximately occurs in the frequency range of 1 GHz to 20 GHz or higher.

* * * * *